(12) United States Patent
Na et al.

(10) Patent No.: US 12,027,764 B2
(45) Date of Patent: *Jul. 2, 2024

(54) METHOD AND APPARATUS FOR SUPPLYING VOLTAGE TO AMPLIFIER USING MULTIPLE LINEAR REGULATORS

(71) Applicant: SAMSUNG ELECTRONICS CO., LTD., Suwon-si (KR)

(72) Inventors: Hyoseok Na, Suwon-si (KR); Jooseung Kim, Suwon-si (KR); Hyunseok Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/117,577

(22) Filed: Mar. 6, 2023

(65) Prior Publication Data

US 2023/0216184 A1 Jul. 6, 2023

Related U.S. Application Data

(63) Continuation of application No. 17/102,955, filed on Nov. 24, 2020, now Pat. No. 11,600,914.

(30) Foreign Application Priority Data

Nov. 26, 2019 (KR) .................. 10-2019-0153306

(51) Int. Cl.
*H01Q 1/40* (2006.01)
*G05F 1/46* (2006.01)
*H03F 3/195* (2006.01)

(52) U.S. Cl.
CPC ............. *H01Q 1/40* (2013.01); *G05F 1/46* (2013.01); *H03F 3/195* (2013.01); *H03F 2200/105* (2013.01); *H03F 2200/451* (2013.01)

(58) Field of Classification Search
CPC .......... G05F 1/46; H01Q 1/40; H02M 1/0045; H02M 1/007; H03F 1/0211;
(Continued)

(56) References Cited

U.S. PATENT DOCUMENTS 9,065,509 B1 6/2015 Yan
9,344,304 B1 5/2016 Cohen
(Continued)

FOREIGN PATENT DOCUMENTS

CN 101682302 3/2010
CN 102195567 A 9/2011
(Continued)

OTHER PUBLICATIONS

International Search Report and Written Opinion dated Mar. 2, 2021 in corresponding International Application No. PCT/KR2020/016667.
(Continued)

*Primary Examiner* — Nguyen T Vo
(74) *Attorney, Agent, or Firm* — Nixon & Vanderhye, P.C.

(57) ABSTRACT

An example electronic device includes an antenna; a switching regulator; a communication chip including an amplifier, a first linear regulator operably connected to the amplifier and the switching regulator and configured to be supplied with a first voltage from the switching regulator, and a second linear regulator operably connected to the amplifier and the switching regulator and configured to be supplied with a second voltage higher than the first voltage from the switching regulator, the communication chip configured to transmit a radio-frequency signal outside of the electronic device through the antenna; and a control circuit. The control circuit is configured to produce an envelope of an input signal input to the amplifier in connection with the
(Continued)

radio-frequency signal and to provide the produced envelope to at least one of the first linear regulator or the second linear regulator. The first linear regulator is configured to provide a third voltage corresponding to the envelope to the amplifier using the first voltage based on the envelope having a voltage in a first range. The second linear regulator is configured to provide a fourth voltage higher than the third voltage to the amplifier using the second voltage based on the voltage of the envelope being in a second range including values larger than values included in the first range.

8 Claims, 21 Drawing Sheets

(58) Field of Classification Search
CPC ......... H03F 2200/102; H03F 2200/105; H03F 2200/24; H03F 2200/451; H03F 2200/504; H03F 3/195; H03F 3/21; H03F 3/24

See application file for complete search history.

(56) References Cited

U.S. PATENT DOCUMENTS

| | | | |
|---|---|---|---|
| 9,614,477 | B1 | 4/2017 | Rozenblit et al. |
| 10,056,864 | B2 | 8/2018 | Hur et al. |
| 10,361,660 | B2 | 7/2019 | Khlat |
| 2007/0200539 | A1 | 8/2007 | Ganti |
| 2008/0009248 | A1 | 1/2008 | Rosenblit et al. |
| 2008/0297246 | A1 | 12/2008 | Taylor |
| 2009/0160251 | A1* | 6/2009 | Mok ................... G05F 1/46 307/24 |
| 2009/0167427 | A1 | 7/2009 | Kawamoto |
| 2010/0244951 | A1 | 9/2010 | Smith |
| 2011/0190028 | A1 | 8/2011 | Hahn |
| 2013/0207467 | A1 | 8/2013 | Fernald |
| 2014/0002053 | A1 | 1/2014 | Wang et al. |
| 2015/0146819 | A1 | 5/2015 | Chowdhury et al. |
| 2017/0194915 | A1 | 7/2017 | Wimpenny |
| 2017/0212721 | A1 | 7/2017 | Satoskar et al. |
| 2017/0223632 | A1 | 8/2017 | Balteanu |
| 2018/0034415 | A1 | 2/2018 | Zhang |
| 2018/0109184 | A1* | 4/2018 | Lee ................. G01R 31/40 |
| 2018/0152144 | A1 | 5/2018 | Choo et al. |
| 2018/0198416 | A1 | 7/2018 | Hur et al. |
| 2018/0348804 | A1 | 12/2018 | Satake |
| 2019/0179403 | A1 | 6/2019 | Tajalli |
| 2020/0099341 | A1 | 3/2020 | Duncan |

FOREIGN PATENT DOCUMENTS

| | | |
|---|---|---|
| CN | 102684494 | 9/2012 |
| CN | 104185953 A | 12/2014 |
| CN | 107565910 | 1/2018 |
| CN | 108107959 | 6/2018 |
| CN | 109478870 A | 3/2019 |
| WO | 2011007556 A1 | 1/2011 |

OTHER PUBLICATIONS

European Search Report and Written Opinion dated Apr. 16, 2021 in corresponding European Application No. 20210134.1.
Kim Joon Hyung et al: "Envelope Amplifier With Multiple-Linear Regulator for Envelope Tracking Power Amplifier", IEEE Transactions on Microwave Theory and Techniques, Plenum, USA, vol. 61, No. 11, Nov. 1, 2013 (Nov. 1, 2013), pp. 3951-3960, XP011531370, ISSN: 0018-9480, DOI: 10.1109/TMTT.2013.2281960 [retrieved on Nov. 1, 2013].
Juliana Gjanci et al: "A Hybrid Scheme for On-Chip Voltage Regulation in System-On-a-Chip (SOC)", IEEE Transactions on Very Large Scale Integration (VLSI) Systems, IEEE Service Center, Piscataway, NJ, USA, vol. 19, No. 11, Nov. 1, 2011 (Nov. 1, 2011), pp. 1949-1959, XP011360233, ISSN: 1063-8210, DOI: 10.1109/TVLSI.2010.2072997.
Examination Report dated Dec. 15, 2021 in corresponding Indian Application No. 202024051082 and English-language translation.
First Office Action dated Dec. 15, 2021 in corresponding Chinese Application No. 202011352705.1 and English-language translation.
Communication pursuant to Article 94(3) EPC dated Aug. 2, 2022 in corresponding European Application No. 20210134.1.
Second Office Action dated Aug. 3, 2022 in corresponding Chinese Application No. 202011352705.1 and English-language translation.
Na et al., U.S. Appl. No. 17/102,955, filed Nov. 24, 2020.
Office Action dated Mar. 29, 2024 in CN Application No. 202310017513.2 and English-language translation.

\* cited by examiner (950)

METHOD AND APPARATUS FOR SUPPLYING VOLTAGE TO AMPLIFIER USING MULTIPLE LINEAR REGULATORS

CROSS-REFERENCE TO RELATED APPLICATIONS

This application is a continuation of U.S. application Ser. No. 17/102,955, filed on Nov. 24, 2020, now U.S. Pat. No. 11,600,914, which claims priority to Korean Patent Application No. 10-2019-0153306, filed on Nov. 26, 2019. The contents of each of these applications are incorporated herein in their entirety.

BACKGROUND

Field

The disclosure relates to a method and an apparatus for providing a voltage to an amplifier using multiple linear regulators.

Description of Related Art

Wireless communication systems have been developed to support higher data transmission rates in order to satisfy the ever-increasing wireless data traffic demands. Supporting high data transmission rates requires wide signal bandwidths and complicates signal modulation schemes, thereby increasing the peak-to-average power ratio (PAPR). Therefore, power amplifiers, which consume a large amount of power inside electronic devices, are being developed to have high-efficiency and high-linearity characteristics.

An envelope tracking (ET) technology may be applied to ensure high-efficiency and high-linearity characteristics with regard to wideband and high-PAPR signals. The ET technology refers to a technology wherein the envelope signal of an RF input signal applied to an amplifier (for example, RF power amplifier) is applied as a power-supply voltage of the amplifier, thereby reducing power consumption. According to the ET technology, the envelope signal is adjusted such that the voltage Vcc applied to the amplifier tracks the envelope of the RF signal, and power consumption is accordingly reduced, thereby enabling the amplifier to operate more efficiently. During signal amplification, the amplifier produces a third-order intermodulation distortion (IMD3), and the IMD3 may have a sweet spot point. The ET technology, if applied to the amplifier, may ensure highly linear characteristics through Vcc shaping which enables the same to track a sweet spot.

The transmission rate of wireless communication systems has rapidly increased in line with their evolution from $3^{rd}$ generation (3G) to 4G, and differential services in mobile service markets have been actively developed. However, mobile communication networks have evolved beyond the same, and there has been strenuous domestic/international research on new 5G mobile communication, such as enhanced mobile broadband (eMBB), ultra-reliable & low-latency communication (URLLC), or massive machine-type communication (mMTC).

Actual implementation of 5G mobile communication may be divided into Sub6 5G and mmWave 5G. Compared with 4G LTE signals, Sub6 5G and mmWave 5G may have more complicated signal modulation schemes for the sake of super-fast data transmission, the rate of which increases in proportion to the frequency, and this may result in a wider bandwidth and a larger PAPR. A wider signal bandwidth makes it difficult to develop a modulator capable of tracking the same. However, the efficiency of the RF power amplifier decreases in the course of transmitting a signal having a large PAPR. Accordingly, the ET technology is applicable. For such reasons, developers of RF system chipset solutions and ET modulators are devoted to developing wideband ET modulators such that the ET technology can be applied to 5G.

The above information is presented as background information only to assist with an understanding of the disclosure. No determination has been made, and no assertion is made, as to whether any of the above might be applicable as prior art with regard to the disclosure.

SUMMARY

Embodiments of the disclosure provide a method and an apparatus wherein a linear regulator of an envelope tracking (ET) modulator is included in a communication chip such that the ET technology can be applied to a wide-bandwidth signal between the linear regulator and the communication chip.

An electronic device according to various example embodiments may include: an antenna; a switching regulator; a communication chip including an amplifier, a first linear regulator operably connected to the amplifier and the switching regulator and configured to be supplied with a first voltage from the switching regulator, and a second linear regulator operably connected to the amplifier and the switching regulator and configured to be supplied with a second voltage higher than the first voltage from the switching regulator, the communication chip configured to transmit a radio-frequency signal outside of the electronic device through the antenna; and a control circuit. The control circuit may be configured to produce an envelope of an input signal input to the amplifier in connection with the radio-frequency signal and to provide the produced envelope to at least one of the first linear regulator or the second linear regulator. The first linear regulator may be configured to provide a third voltage corresponding to the envelope to the amplifier using the first voltage based on the envelope having a voltage in to a first range. The second linear regulator may be configured to provide a fourth voltage higher than the third voltage to the amplifier using the second voltage based on the voltage of the envelope having a voltage in a second range including values larger than values included in the first range.

A communication chip configured to process a radio-frequency signal received or transmitted in an electronic device, according to various example embodiments, may include: an amplifier; a first linear regulator operably connected to the amplifier; and a second linear regulator operably connected to the amplifier. The first linear regulator may be configured to receive a first voltage supplied from the switching regulator of the electronic device and to provide a third voltage to the amplifier using the first voltage. The second linear regulator may be configured to receive a second voltage supplied from the switching regulator and to provide a fourth voltage to the amplifier using the second voltage.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
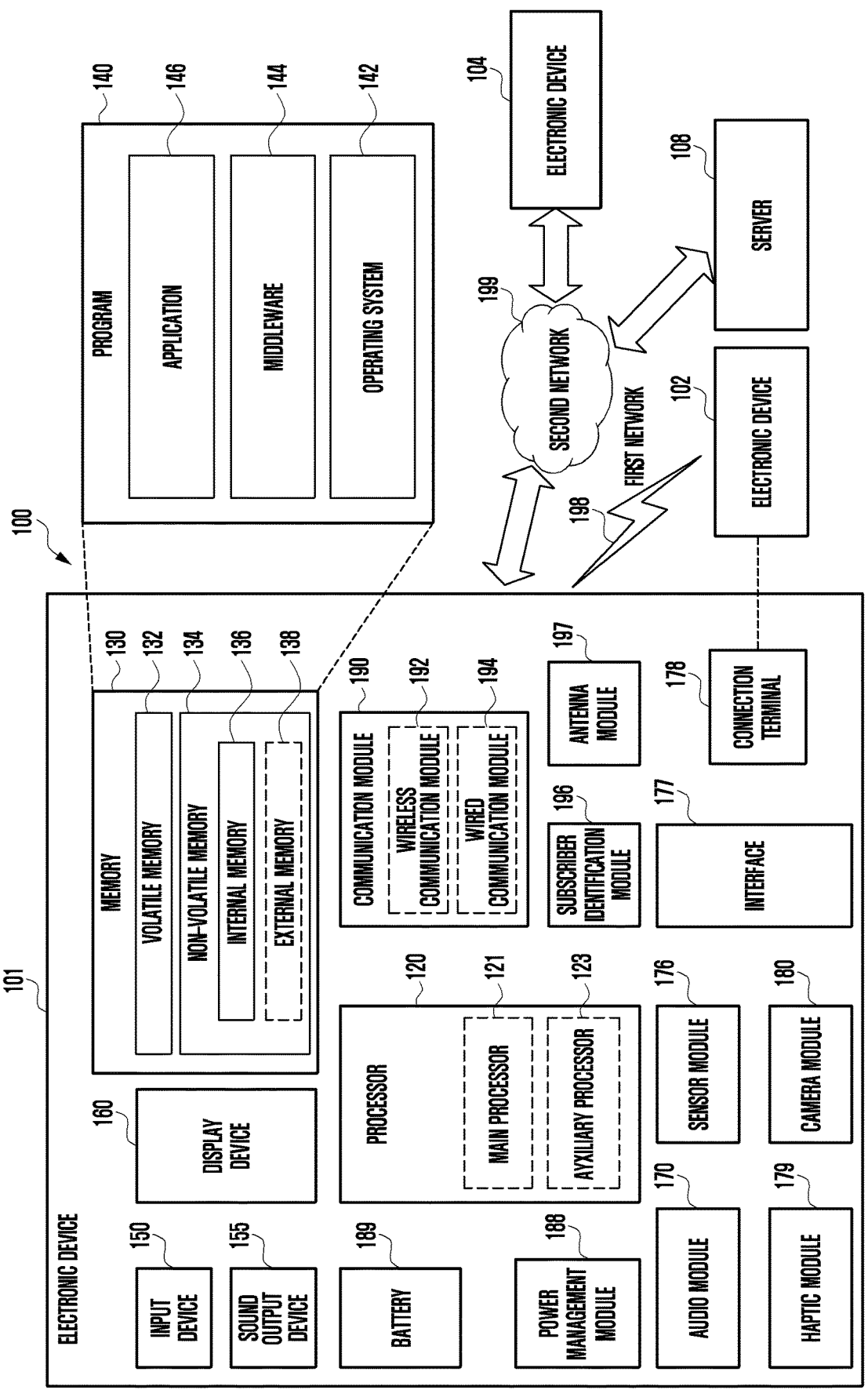
FIG. 1 is a block diagram illustrating an example electronic device in a network environment according to various embodiments.

The electronic device according to various embodiments may be one of various types of electronic devices. The electronic devices may include, for example, and without limitation, a portable communication device (e.g., a smart phone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combinations thereof and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
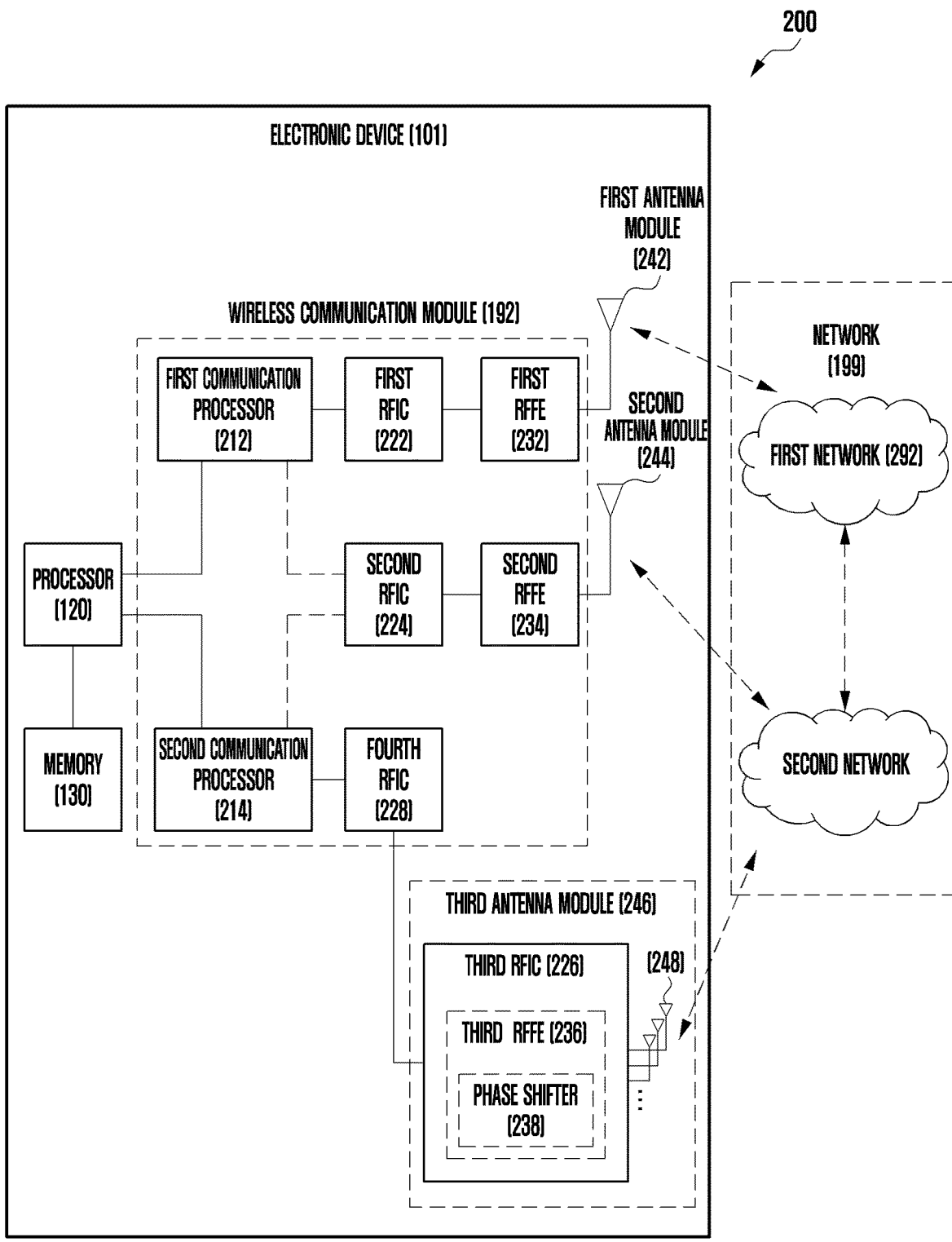
FIG. 2 is a block diagram illustrating an example electronic device supporting legacy network communication and 5G network communication according to various embodiments.

FIG. 2 is a block diagram 200 illustrating an example electronic device 101 for supporting legacy network communication and 5G network communication according to various embodiments.

Referring to FIG. 2, the electronic device 101 may include a first communication processor (e.g., including processing circuitry) 212, a second communication processor (e.g., including processing circuitry) 214, a first radio frequency integrated circuit (RFIC) 222, a second RFIC 224, a third RFIC 226, a fourth RFIC 228, a first radio frequency front end (RFFE) 232, a second RFFE 234, a first antenna module (e.g., including at least one antenna) 242, a second antenna module (e.g., including at least one antenna) 244, and an antenna 248. The electronic device 101 may further include a processor (e.g., including processing circuitry) 120 and a memory 130.

The network 199 may include a first network (e.g., a legacy network) 292 and a second network (e.g., a 5G network) 294. According to another embodiment, the electronic device 101 may further include at least one component among the components illustrated in FIG. 1, and the network 199 may further include at least one different network. According to an embodiment, the first communication processor 212, the second communication processor 214, the first RFIC 222, the second RFIC 224, the fourth RFIC 228, the first RFFE 232, and the second RFFE 234 may form at least a part of the wireless communication module 192. According to another embodiment, the fourth RFIC 228 may be omitted or included as a part of the third RFIC 226.

The first communication processor 212 may include various communication processing circuitry and support establishment of a communication channel in a band to be used for wireless communication with the first network 292, and legacy network communication through the established communication channel. According to various embodiments, the first network may be a legacy network including, for example, and without limitation, a 2G, 3G, 4G, or long term evolution (LTE) network. The second communication processor 214 may support establishment of a communication channel corresponding to a designated band (for example, about 6 GHz to about 60 GHz) among bands to be used for wireless communication with the second network 294, and, for example, and without limitation, 5G network communication through the established communication channel. According to various embodiments, the second network 294 may, for example, be a 5G network as referenced by third generation partnership project (3GPP).

Additionally, according to an embodiment, the first communication processor 212 or the second communication processor 214 may support establishment of a communication channel corresponding to another designated band (for example, about 6 GHz or lower) among the bands to be used for wireless communication with the second network 294, and, for example, 5G network communication through the established communication channel. According to an embodiment, the first communication processor 212 and the second communication processor 214 may be implemented inside a single chip or a single package. According to various embodiments, the first communication processor 212 or the second communication processor 214 may, for example, be provided inside a single chip or a single package together with a processor 120, an auxiliary processor 123, or a communication module 190.

The first RFIC 222 may convert a baseband signal generated by the first communication processor 212 into a radio frequency (RF) signal at about 700 MHz to about 3 GHz, which may be used for the first network 292 (for example, legacy network), during transmission. During reception, an RF signal may be acquired from the first network 292 (for example, legacy network) through an antenna (for example, the first antenna module 242), and may be preprocessed through an RFFE (for example, the first RFFE 232). The first RFIC 222 may convert the preprocessed RF signal into a baseband signal such that the same can be processed by the first communication processor 212.

The second RFIC 224 may convert a baseband signal generated by the first communication processor 212 or the second communication processor 214 into an RF signal in a Sub6 band (for example, about 6 GHz or lower) (hereinafter, referred to as a 5G Sub6 RF signal) that may be used for the second network 294 (for example, 5G network). During reception, a 5G Sub6 RF signal may be acquired from the second network 294 (for example, 5G network) through an antenna (for example, the second antenna module 244), and may be preprocessed through an RFFE (for example, the second RFFE 234). The second RFIC 224 may convert the preprocessed 5G Sub6 RF signal into a baseband signal such that the same can be processed by a communication processor corresponding to the first communication processor 212 or the second communication processor 214.

The third RFIC 226 may convert a baseband signal generated by the second communication processor 214 into an RF signal in a 5G Above6 band (for example, about 6 GHz to about 60 GHz) (hereinafter, referred to as a 5G Above6 signal) that is to be used for the second network 294 (for example, 5G network). During reception, a 5G Above6 RF signal may be acquired from the second network 294 (for example, 5G network) through an antenna (for example, the antenna 248), and may be preprocessed through the third RFFE 236. The third RFIC 226 may convert the preprocessed 5G Above6 signal into a baseband signal such that the same can be processed by the second communication processor 214. According to an embodiment, the third RFFE 236 may be formed as a part of the third RFIC 226.

According to an embodiment, the electronic device 101 may include a fourth RFIC 228 separately from the third RFIC 226 or as at least a part thereof. In this example, the fourth RFIC 228 may convert a baseband signal generated by the second communication processor 214 into an RF signal in an intermediate frequency band (for example, about 9 GHz to about 11 GHz) (hereinafter, referred to as an IF signal) and then deliver the IF signal to the third RFIC 226. The third RFIC 226 may convert the IF signal into a 5G Above6 RF signal. During reception, a 5G Above6 RF signal may be received from the second network 294 (for example, 5G network) through an antenna (for example, antenna 248) and converted into an IF signal by the third RFIC 226. The fourth RFIC 228 may convert the IF signal into a baseband signal such that the same can be processed by the second communication processor 214.

According to an embodiment, the first RIFC 222 and the second RFIC 224 may, for example, be implemented as at least a part of a single chip or a single package. According to an embodiment, the first RFFE 232 and the second RFFE 234 may, for example, be implemented as at least a part of a single chip or a single package. According to an embodiment, at least one antenna module of the first antenna module 242 or the second antenna module 244 may be omitted or coupled to another antenna module so as to process RF signal in multiple corresponding bands.

According to an embodiment, the third RFIC 226 and the antenna 248 may be arranged on the same substrate so as to form a third antenna module 246. For example, the wireless communication module 192 or the processor 120 may be arranged on a first substrate (for example, main PCB). In this example, the third RFIC 226 may be formed on a partial area (for example, lower surface) of a second substrate (for example, sub PCB) that is separate from the first substrate, and the antenna 248 may be arranged in another partial area (for example, upper surface), thereby forming a third antenna module 246. The third RFIC 226 and the antenna 248 may be arranged on the same substrate such that the length of the transmission line between the same can be reduced. This may reduce loss (for example, attenuation) of a signal in a high-frequency band (for example, about 6 GHz to about 60 GHz) used for 5G network communication, for example, due to the transmission line. Accordingly, the electronic device 101 may improve the quality or speed of communication with the second network 294 (for example, 5G network).

According to an embodiment, the antenna 248 may, for example, include an antenna array including multiple antenna elements that may be used for beamforming. In this example, the third RFIC 226 may include multiple phase shifters 238 corresponding to the multiple antenna elements, as a part of the third RFFE 236, for example. During transmission, each of the multiple phase shifters 238 may shift the phase of a 5G Above6 RF signal, which is to be transmitted to the outside (for example, base station of 5G network) of the electronic device 101, through a corresponding antenna element. During reception, each of the multiple phase shifters 238 may shift the phase of a 5G Above6 RF signal received from the outside into the same or substantially same phase through a corresponding antenna element. This enables transmission or reception through beamforming between the electronic device 101 and the outside.

The second network 294 (for example, 5G network) may be operated independently of the first network 292 (for example, legacy network) (for example, standalone (SA)), or operated while being connected thereto (for example, non-standalone (NSA)). For example, the 5G network may include an access network (for example, 5G radio access network (RAN) or next-generation network (NG RAN)) and may not include a core network (for example, next-generation core (NGC)). In this example, the electronic device 101 may access the access network of the 5G network and then access an external network (for example, Internet) under the control of the core network (for example, evolved packed core (EPC)) of the legacy network. Protocol information (for example, LTE protocol network) for communication with the legacy network or protocol information (for example, new radio (NR) protocol information) for communication with the 5G network may be stored in the memory 130, and may be accessed by another component (for example, the processor 120, the first communication processor 212, or the second communication processor 214).

Figure 3A:
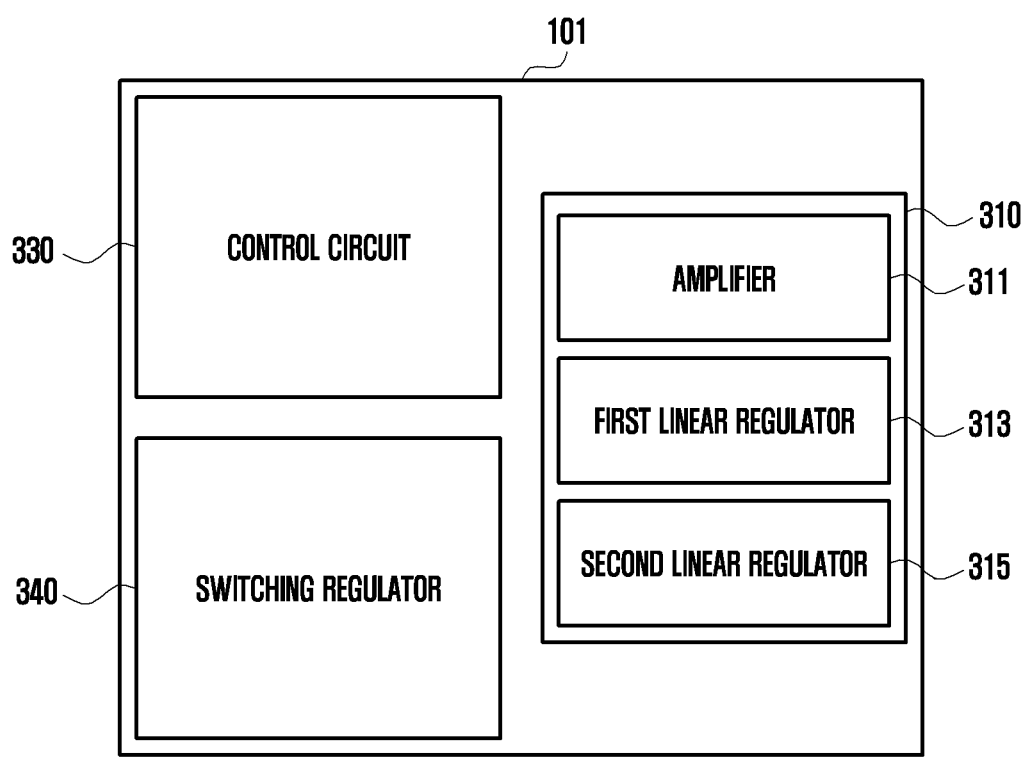
FIG. 3A is a block diagram illustrating an example configuration of an electronic device including multiple linear regulators in a communication chip of the electronic device according to various embodiments.
Figure 3B:
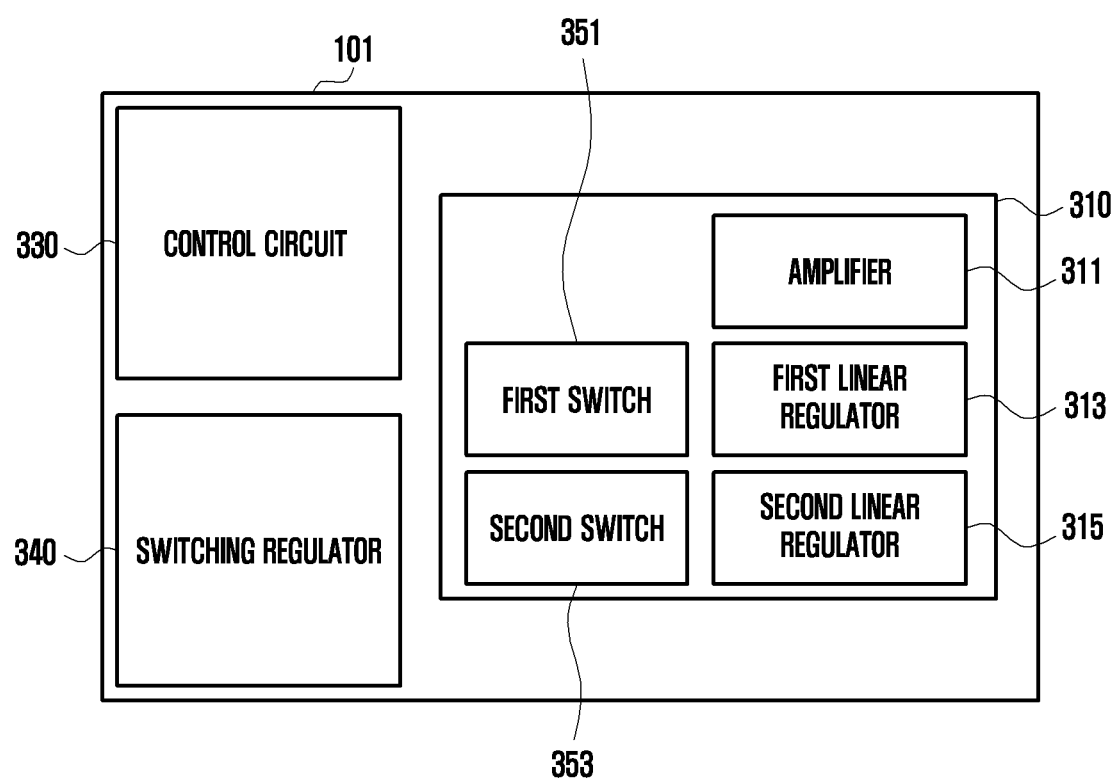
FIG. 3B is a block diagram illustrating an example configuration of an electronic device including multiple linear regulators in a communication chip of the electronic device according to various embodiments.
Figure 3C:
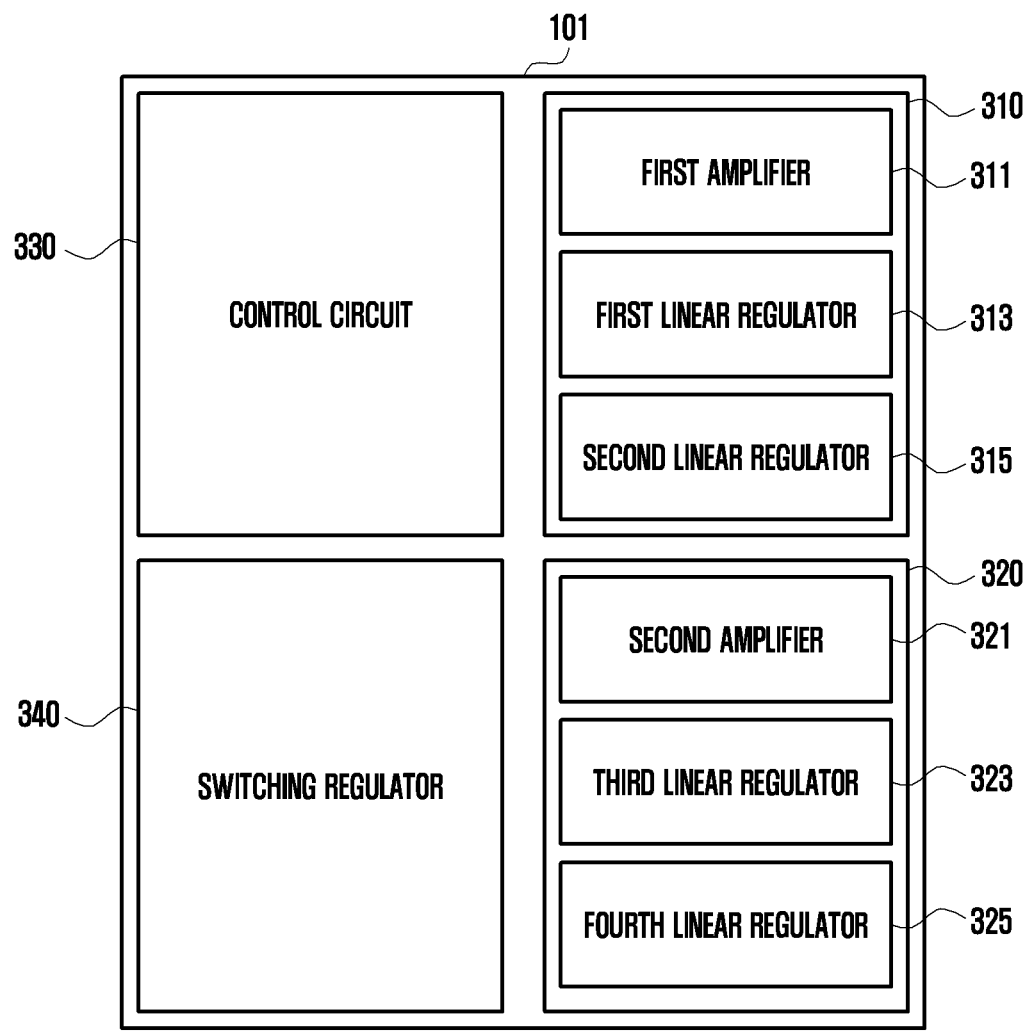
FIG. 3C is a block diagram illustrating an example configuration of an electronic device including multiple linear regulators in a communication chip of the electronic device according to various embodiments.

FIG. 3A is a block diagram illustrating an example configuration of an electronic device including multiple linear regulators in a communication chip of an example electronic device according to various embodiments, FIG. 3B is a block diagram illustrating an example configuration of an electronic device including multiple linear regulators in a communication chip of the electronic device according to various embodiments, and FIG. 3C is a block diagram illustrating an example configuration of an electronic device including multiple linear regulators in a communication chip of the electronic device according to various embodiments.

In FIGS. 3A, 3B and 3C (which may be referred to hereinafter as FIG. 3A to FIG. 3C for convenience), although expressions "first" and "second" are used to distinguish communication chips (for example, first communication chip 310 and second communication chip 320), amplifiers (for example, first amplifier 311 and second amplifier 321), and linear regulators (for example, first linear regulators 313 and second linear regulators 315), the elements may perform the same or similar functions. In other words, the expressions "first" and "second" are used only to facilitate identification, and do not limit the scope of the disclosure. In an embodiment, the first communication chip 310 and the second communication chip 320 may be configured to process signals in different frequency bands. In an embodiment, the first linear regulator 313 and the second linear regulator 315 may supply (or provide) different voltages (or voltage levels).

FIG. 3A is a diagram illustrating an example configuration of an example electronic device according to an embodiment.

Referring to FIG. 3A, the electronic device according to various embodiments (for example, the electronic device 101 in FIG. 1) may include a first communication chip 310, a control circuit 330, and/or a switching regulator 340. The first communication chip 310 may include an amplifier 311, a first linear regulator 313, and/or a second linear regulator 315.

The first communication chip 310 according to various embodiments may include, besides the above components, one or more other components (for example, a low-noise amplifier, an MIPI controller, an antenna switch). The first communication chip 310 may be formed as an integrated circuit or chip (for example, a single chip). The first communication chip 310 may be positioned on a printed circuit board of the electronic device 101 as a separate chip distinguished from the switching regulator 340. In an embodiment, the first communication chip 310 may be included in an RFFE in FIG. 2 (for example, the first RFFE 232, the second RFFE 234, or the third RFFE 236).

The first communication chip 310 may receive an input signal related to communication (for example, wireless communication) from a communication processor (for example, the first communication processor 212 in FIG. 2) through an RFIC (for example, the first RFIC 222 or the second RFIC 224 in FIG. 2), may amplify the received input signal, and may output a radio-frequency signal. The input signal and the radio-frequency signal may be the same or similar signal, differing only in the magnitude of the signal power (or voltage). Hereinafter, in order to distinguish between the signal input to the first amplifier 311 and the signal output from the first amplifier 311, the signal input to the first amplifier 311 may be referred to as an "input signal", and the signal output from the first amplifier 311 may be referred to as a "radio-frequency signal".

According to various embodiments, the first communication chip 310 may amplify the input signal (or first input signal) into a high-power signal using the first amplifier 311. The signal input to the first amplifier 311, in order to distinguish the same from the input signal input to the second amplifier 320 in FIG. 3C, may be referred to as a "first input signal", and the input signal input to the second amplifier 320 may be referred to as a "second input signal". The first amplifier 311 may be configured to amplify the first input signal. The first amplifier 311 may amplify the first input signal using a power supply (for example, fixed power-supply voltage) supplied from a power management module of the electronic device 101 (for example, the power management module 188 in FIG. 1). If the first amplifier 311 amplifies the first input signal using a fixed power supply, unnecessary power dissipation may occur. Since the first amplifier 311 consumes a large amount of power in the electronic device 101, the same may need to have high-efficiency and high-linearity characteristics. In order for the first amplifier 311 to have high-efficiency and high-linearity characteristics, at least one of, for example, an envelope tracking (ET) technology (or algorithm), an average power tracking (APT) technology, or a step power tracking (SPT) technology may be applied to the first amplifier 311.

According to various embodiments, the ET technology may refer, for example, to a technology wherein, based on the envelope of the first input signal input to an amplifier (for example, the first amplifier 311), a voltage (or power supply) is provided to the first amplifier 311, thereby reducing power consumed by the amplifier 311. According to the ET technology, the voltage Vcc applied to the first amplifier 311 may be made to track the envelope of the first input signal, thereby enabling the first amplifier 311 to operate while reducing power dissipation (or increasing the power efficiency of the first amplifier 311).

According to various embodiments, the APT technology or the SPT technology may be used, in order to reduce power consumed by an amplifier (for example, the first amplifier 311), so as to change the voltage supplied to the first amplifier 311. If the ET technology is not applied to the first amplifier 311, the APT technology or the SPT technology may be applied instead. If the APT technology or the SPT technology is applied to the first amplifier 311, the same voltage supplied from the power management module 188 to the switching regulator 340 may be input to the first amplifier 311. If the voltage supplied to the switching regulator 340 is input to the first amplifier 311, the first linear regulator 313 and the second linear regulator 315 may not operate.

In an embodiment, which one of the ET technology, the APT technology, and the SPT technology is to be applied to the first amplifier 311 may be determined based on a signal control table stored in the memory of the electronic device 101 (for example, the memory 130 in FIG. 1). The signal control table may be stored in the memory 130 based on the performance of the first communication chip 310 included in the electronic device 101, for example, or an antenna (for example, the first antenna module 242). The signal control table may include a code value corresponding to power (or voltage) of an input signal. The control circuit 330 may control, based on the signal control table, one of the ET technology, the APT technology, or the SPT technology to be applied to the first amplifier 311.

According to various embodiments, the first linear regulator 313 may be operably connected to the first amplifier 311 and the switching regulator 340, and may receive a first voltage (or current/power supply) supplied from the switching regulator 340. The second linear regulator 315 may be operably connected to the first amplifier 311 and the switching regulator 340, and may receive a second voltage, which is higher than the first voltage, supplied from the switching regulator 340. The first voltage and the second voltage may differ from each other. As an example, the first voltage may be relatively low, and the second voltage may be relatively high. As another example, the first voltage may be relatively high, and the second voltage may be relatively low. The first linear regulator 313 may be configured to supply a third voltage (or current) to the first amplifier 311 according to the envelope of the first input signal using the first voltage. In an embodiment, if the voltage of the envelope of the first input signal is in a first range, the first linear regulator 313 may provide the first amplifier 311 with a third voltage corresponding to the envelope. The third voltage may be equal to or higher than the first voltage, for example.

According to an embodiment, the second linear regulator 315 may be configured to supply a fourth voltage, which is higher than the third voltage, to the first amplifier 311 according to the envelope of the first input signal using the second voltage. For example, the third voltage and the fourth voltage may differ from each other. If the voltage of the envelope of the first input signal is in a second range, the second linear regulator 315 may provide the first amplifier 311 with a fourth voltage corresponding to the envelope. The second range may include values larger than values included in the first range. The fourth voltage may be equal to or higher than the second voltage, for example.

According to an embodiment, the first range may be determined based on the first voltage, and the second range may be determined based on the second voltage. The first range and the second range may or may not overlap each other. For example, values in the second range (for example, 1.5-2V) may be larger than values in the first range (for example, 1-1.49V). Example values given above are only provided to aid in understanding of the disclosure, and descriptions thereof do not limit the disclosure. According to an embodiment, if the voltage of the envelope of the first input signal is a value between the first range and the second range, the first linear regulator 313 may be driven, and the second regulator 315 may not be driven.

As another example, if the voltage of the envelope of the first input signal is a value between the first range and the second range, the first linear regulator 313 may not be driven, and the second linear regulator 315 may be driven. As another example, if a threshold value is set between the first voltage and the second voltage such that the voltage of the envelope of the first input signal is equal to/below the threshold value, the first linear regulator 313 may be driven, and if the voltage exceeds the threshold value, the second linear regulator 315 may be driven. This is only an example design modification, the description of which is not limiting in any manner.

The first linear regulator 313 or the second linear regulator 315, which controls (or adjusts) a voltage, may be designed to operate with a linear relation between input and output. The first linear regulator 313 or the second linear regulator 315, which has high-speed characteristics, may produce a high-frequency signal of the voltage of the envelope of the first input signal. The first linear regulator 313 or the second linear regulator 315 may receive the envelope of the first input signal from the control circuit 330.

For example, the first linear regulator 313 may control (or adjust) the third voltage so as to correspond to the envelope of the first input signal. The first linear regulator 313 may provide the first amplifier 311 with the third voltage obtained by adjusting the first voltage so as to correspond to the envelope. The second linear regulator 315 may control (or adjust) the fourth voltage so as to correspond to the envelope of the first input signal. The second linear regulator 315 may provide the first amplifier 311 with the fourth voltage obtained by adjusting the second voltage so as to correspond to the envelope.

According to various embodiments, the first linear regulator 313 or the second linear regulator 315 may regulate and thus compensate for noise included in a signal output from the switching regulator 340. Even if a signal (for example, a low-frequency signal or a first voltage) output from the switching regulator 340 is distorted by a trace (for example, an electric path along which a signal from the switching regulator 340 is transferred), the first linear regulator 313 or the second linear regulator 315 may regulate the same and may provide the first amplifier 311 with the third voltage or the fourth voltage.

According to various embodiments, the first linear regulator 313 or the second linear regulator 315 and the first amplifier 311 may be disposed inside the first communication chip 310, and the switching regulator 340 may be disposed outside the first communication chip 310. The first linear regulator 313 or the second linear regulator 315 may adjust the voltage output from the switching regulator 340 to correspond to the envelope of the first input signal, and may provide the same to the first amplifier 311. The first length (or distance) between the first linear regulator 313 or the second linear regulator 315 and the first amplifier 311 may be shorter than the second length between the switching regulator 340 and the amplifier 311. This may reduce the restriction resulting from the distance between the switching regulator 340 and the first amplifier 311.

According to various embodiments, the switching regulator 340 may provide a relatively large voltage (for example, a first voltage or a second voltage) to the first linear regulator 313 or the second linear regulator 315. The first linear regulator 313 may micro-adjust the first voltage from the switching regulator 340 and may provide the resulting third voltage to the amplifier 311, and the second linear regulator 315 may micro-adjust the second voltage from the switching regulator 340 and may provide the resulting fourth voltage to the amplifier 311. As a result of the first linear regulator 313 or the second linear regulator 315, which is included in the first communication chip 310, micro-adjusting a voltage and providing the same to the first amplifier 311 included in the first communication chip 310, the power efficiency of the first amplifier 311 may be improved compared with the case in which a voltage is provided to the first amplifier 311 from outside the first communication chip 310.

The switching regulator 340 may be operably connected to the first linear regulator 313 or the second linear regulator 315. As another example, the switching regulator 340 may be operably connected to the power management module 180 in FIG. 1. Using a voltage input from the power management module 180, the switching regulator 340 may simultaneously provide different voltages to the first linear regulator 313 and the second linear regulator 315. The switching regulator 340 may make a single input (for example, an input from the power management module 180) and multiple outputs (for example, outputs to the first linear regulator 313 and the second linear regulator 315).

According to various embodiments, the switching regulator 340, which may be configured to adjust (or control) a voltage, may supply a desired voltage while turning on or off a switch element (for example, a MOSFET). In an embodiment, the switching regulator 340 may include a direct current (DC)-DC converter, such as a buck converter, a boost converter, or a buck-boost converter. The switching regulator 340 may produce a low-frequency signal of the voltage of the envelope of the first input signal input to the first amplifier 311. For example, the switching regulator 340 may provide the first voltage to the first linear regulator 313 and may provide the second voltage to the second linear regulator 315.

Although the first communication chip 310 is illustrated in FIG. 3A as including two linear regulators, the first communication chip 310 may include more than two linear regulators. The disclosure is not limited by the drawings or descriptions. For example, if the first communication chip 310 includes four linear regulators, the switching regulator 340 may provide different voltages to the four linear regulators. If multiple linear regulators are included, voltages may be provided more efficiently, but an increased number of linear regulators may increase the area (for example, the linear regulator mounting area) and may result in expenditure (for example, linear regulator usage expenditure). The number of linear regulators included in the first communication chip 310 may be determined in view of the performance of the linear regulators or the efficiency of the electronic device 101.

According to an embodiment, the control circuit 330 may be configured to produce an envelope (for example, a first envelope) corresponding to the first input signal. The control circuit 330 may produce the envelope such that the envelope tracks the first input signal. The control circuit 330 may provide the produced envelope to at least one of the first linear regulator 313 or the second linear regulator 315.

According to an embodiment, the control circuit 330 may control the first linear regulator 313 or the second linear regulator 315 to be used selectively according to the situation. The first linear regulator 313 or the second linear regulator 315, which is designed to be optimized for the corresponding power (for example, the first voltage or the second voltage), may output power with a high efficiency with regard to each type of power. The control circuit 330 may produce the envelope such that the first linear regulator 313 or the second linear regulator 315 is selectively driven according to the voltage of the envelope of the first input signal.

According to various embodiments, the control circuit 330 may have a comprehensive concept encompassing circuits for controlling wireless communication in various embodiments, such as a communication processor (for example, the processor 120 in FIG. 1, the first communication processor 212 or the second communication processor 214 in FIG. 2), an RFIC (for example, the first RFIC 222 or the second RFIC 224 in FIG. 2), a wireless communication module (for example, the wireless communication module 192 in FIG. 1 or FIG. 2), or an envelope tracking digital-analog converter (ET DAC), for example. For example, the control circuit 330 may be included inside at least one of the first communication processor 212, the first RFIC 222, or the first communication chip 310.

FIG. 3B is a block diagram illustrating an example configuration of an example electronic device according to various embodiments.

Referring to FIG. 3B, the electronic device according to various embodiments (for example, the electronic device 101 in FIG. 1) may include a first communication chip 310, a control circuit 330, and/or a switching regulator 340. The first communication chip 310 may include a first amplifier 311, a first linear regulator 313, a second linear regulator 315, a first switch (or switch module) 351, and a second switch 353.

The first communication chip 310, the first linear regulator 313, the second linear regulator 315, the control circuit 330, or the switching regulator 340 has been described in detail with reference to FIG. 3A, and repeated descriptions thereof will not be repeated here.

According to various embodiments, the first switch 351 may be operably connected to the switching regulator 340 and the first linear regulator 313. The first switch 351 may be disposed between the switching regulator 340 and the first linear regulator 313. For example, the first switch 351 may be disposed between the output terminal of the switching regulator 340 and the output terminal of the first linear regulator 313. The second switch 353 may be operably connected to the switching regulator 340 and the second linear regulator 315. The second switch 353 may be disposed between the switching regulator 340 and the second linear regulator 315. For example, the second switch 353 may be disposed between the output terminal of the switching regulator 340 and the output terminal of the second linear regulator 315.

According to various embodiments, the control circuit 330 may control the first switch 351 or the second switch 353 according to the input signal such that the APT technology or the SPT technology is applied to the first amplifier 311. In an embodiment, the control circuit 330 may apply the APT technology or the SPT technology to the first amplifier 311, based on a signal control table stored in the memory 130. For example, if it is difficult to secure a high-efficiency dynamic range of the first linear regulator 313 or the second linear regulator 315, the control circuit 330 may implement an APT operation or SPT operation by directly using a voltage (for example, a first voltage or a second voltage) output from the switching regulator 340. The control circuit 330 may control the first switch 351 or the second switch 353 such that the voltage output from the switching regulator 340 is supplied to the first amplifier 311 with no change.

According to an embodiment, if the input signal corresponds to a first code value stored in the signal control table, the control circuit 330 may turn on the first switch 351 such that a first voltage supplied from the switching regulator 340 to the first linear regulator 313 is controlled to be supplied to the first amplifier 311 with no change. If the first switch 351 is turned on, the first linear regulator 313 may not operate. The control circuit 330 may turn off the first switch 351 such that the first voltage output from the switching regulator 340 is controlled to be provided to the first linear regulator 313. If the first switch 351 is turned off, and if the voltage of the envelope of the first input signal corresponds to a first range, the first linear regulator 313 may provide the first amplifier 311 with a third voltage corresponding to the envelope.

According to an embodiment, if the input signal corresponds to a second code value stored in the signal control table, the control circuit 330 may turn on the second switch 353 such that a second voltage supplied from the switching regulator 340 to the second linear regulator 315 is controlled to be supplied to the first amplifier 311 with no change. If the second switch 353 is turned on, the second linear regulator 315 may not operate. The control circuit 330 may turn off the second switch 353 such that a second voltage output from the switching regulator 340 is controlled to be provided to the second linear regulator 315. If the second switch 353 is turned off, and if the voltage of the envelope of the first input signal is in a second range, the second linear regulator 315 may provide the first amplifier 311 with a fourth voltage corresponding to the envelope. For example, the fourth voltage may be higher than the third voltage.

FIG. 3C is a block diagram illustrating an example configuration of an example electronic device according to various embodiments.

Referring to FIG. 3C, the electronic device according to various embodiments (for example, the electronic device 101 in FIG. 1) may include a first communication chip 310, a second communication chip 320, a control circuit 330, and/or a switching regulator 340. The first communication chip 310 may include at least one of a first amplifier 311, a first linear regulator 313, and a second linear regulator 315. The second communication chip 320 may include a second amplifier 321, a third linear regulator 323, and a fourth linear regulator 325.

The first communication chip 310, the first linear regulator 313, the second linear regulator 315, the control circuit 330, or the switching regulator 340 has been described in detail with reference to FIG. 3A, and repeated descriptions thereof will not be repeated here.

According to various embodiments, the first communication chip 310 may be included in the first RFFE 232 in FIG. 2, and the second communication chip 320 may be included in the second RFFE 234 in FIG. 2. According to various embodiments, the second communication chip 320 may further include one or more other components (for example, a low-noise amplifier, an MIPI controller, an antenna switch) than the above components. The second communication chip 320 may be implemented as an integrated circuit or chip (for example, a single chip). The second communication chip 320 may be positioned on the printed circuit board of the electronic device 101 as a separate chip distinguished from the switching regulator 340. In an embodiment, each of the first communication chip 310 and the second communication chip 320 may be mounted on the printed circuit board of the electronic device 101 as a separate chip.

According to an embodiment, the second communication chip 320 may receive a second input signal related to communication (for example, wireless communication) from a communication processor (for example, the first communication processor 212 in FIG. 2) through the second RFIC 224 in FIG. 2, may amplify the received second input signal, and may output a second radio-frequency signal. The second input signal and the second radio-frequency signal may be the same signal, differing only in the magnitude of the signal power (or voltage). Hereinafter, in order to distinguish between the signal input to the second amplifier 321 and the signal output from the second amplifier 321, the signal input to the second amplifier 321 may be referred to as a "second input signal", and the signal output from the second amplifier 321 may be referred to as a "second radio-frequency signal". In addition, the signal input to the first amplifier 311 may be referred to as a "first input signal", and the signal output from the first amplifier 311 may be referred to as a "first radio-frequency signal".

According to various embodiments, the first input signal may be a signal corresponding to a first frequency band, and the second input signal may be a signal corresponding to a second frequency band. The first frequency band may be a frequency band configured in the first communication chip 310, and the second frequency band may be a frequency band configured in the second communication chip 320. The first frequency band and the second frequency band may be equal to or different from each other.

According to various embodiments, the first frequency band or the second frequency band may include, for example, and without limitation, at least one of a band of about 700 MHz to 3 GHz used for a first network (for example, the first network 292 in FIG. 2 or a legacy network), a Sub6 band (for example, about 6GH or lower) used for a second network (for example, the second network 294 in FIG. 2 or a 5G network), an intermediate frequency band (for example, about 9GH to about 11 GHz), or a 5G Above6 band (for example, about 6GH to about 60 GHz). The first frequency band may be lower than the second frequency band. For example, the first frequency band may include, for example, and without limitation, a band of about 700 MHz to about 3 GHz, and the second frequency band may be a 5G Above6 band (for example, about 6 GHz to about 60 GHz). Such descriptions are simply provided to aid in understanding of the disclosure, and do not limit the disclosure.

According to an embodiment, the second amplifier 321 may be configured to amplify the second input signal. The second amplifier 321 may amplify the second input signal using a power supply (for example, a fixed power-supply voltage) supplied from the power management module (for example, the power management module 188 in FIG. 1) of the electronic device 101. In order for the second amplifier 321 to have high-efficiency and high-linearity characteristics, at least one of the ET technology (or algorithm), the APT technology, or the SPT technology may be applied to the second amplifier 321.

The third linear regulator 323 or the fourth linear regulator 325 described below, although referred to as "third" or "fourth" to be distinguished from the first linear regulator 313 or the second linear regulator 315 included in the first communication chip 310, may be identical or similar thereto.

According to various embodiments, the third linear regulator 323 may be operably connected to the second amplifier 321 and the switching regulator 340 and may receive a fifth voltage (or current/power supply) supplied from the switching regulator 340. The fourth linear regulator 325 may be operably connected to the second amplifier 321 and the switching regulator 340 and may receive a sixth voltage supplied from the switching regulator 340. For example, the fifth voltage and the sixth voltage may differ from each other. As an example, the fifth voltage may be relatively low, and the sixth voltage may be relatively high. As another example, the fifth voltage may be relatively high, and the sixth voltage may be relatively low. The third linear regulator 323 may be configured to supply a seventh voltage to the second amplifier 321 according to the envelope of the second input signal using the fifth voltage. If the voltage of the envelope of the second input signal input to the second amplifier 321 is in a third range, the third linear regulator 323 may provide the second amplifier 321 with a seventh voltage corresponding to the envelope. The seventh voltage may be equal to or higher than the fifth voltage, for example.

According to an embodiment, the fourth linear regulator 325 may be configured to supply an eighth voltage to the second amplifier 321 according to the envelope of the second input signal using the sixth voltage. For example, the sixth voltage and the eighth voltage may differ from each other. As another example, the eighth voltage may be equal to or higher than the sixth voltage. If the voltage of the envelope of the second input signal is in a fourth range, the fourth linear regulator 325 may provide the second amplifier 321 with an eighth voltage corresponding to the envelope. The fourth range may include values larger than values included in the third range, for example.

According to an embodiment, the third range may be determined based on the fifth voltage, and the fourth range may be determined based on the sixth voltage. The third range and the fourth range may or may not overlap each other. For example, values in the fourth range (for example, 2.1-2.3V) may be larger than values in the third range (for example, 1.8-2.0V). Example values given above are merely provided to aid in understanding of the disclosure, and descriptions thereof do not limit the disclosure.

According to an embodiment, if the voltage of the envelope of the second input signal is a value between the third range and the fourth range, the third linear regulator 323 may be driven, and the fourth linear regulator 325 may not be driven. As another example, if the voltage of the envelope of the second input signal is a value between the third range and the fourth range, the third linear regulator 323 may not be driven, and the fourth linear regulator 325 may be driven. As another example, if a threshold value is set between the fifth voltage and the sixth voltage such that the voltage of the envelope of the second input signal is equal to/below the threshold value, the third linear regulator 323 may be driven, and if the voltage exceeds the threshold value, the fourth linear regulator 325 may be driven. This is merely an example design modification, the description of which is not limiting in any manner.

According to an embodiment, the third linear regulator 323 or the fourth linear regulator 325, which controls (or adjusts) a voltage, may be designed to operate with a linear relation between input and output. The third linear regulator 323 or the fourth linear regulator 325 may produce a high-frequency signal of the voltage of the envelope of the second input signal applied to the second amplifier 321. The third linear regulator 323 or the fourth linear regulator 325 may receive the envelope of the second input signal from the control circuit 330.

For example, the third linear regulator 323 may control (or adjust) the seventh voltage so as to correspond to the envelope of the second input signal. The third linear regulator 323 may provide the second amplifier 321 with the seventh voltage obtained by adjusting the fifth voltage so as to correspond to the envelope. The fourth linear regulator 325 may control (or adjust) the eighth voltage so as to correspond to the envelope of the second input signal. The fourth linear regulator 325 may provide the second amplifier 321 with the eighth voltage obtained by adjusting the sixth voltage so as to correspond to the envelope.

According to various embodiments, the third linear regulator 312 or the fourth linear regulator 325 may regulate and thus compensate for noise included in a signal output from the switching regulator 340. Even if a signal (for example, a low-frequency signal or a fifth voltage) output from the switching regulator 340 is distorted by a second electric path along which a signal from the switching regulator 340 is transferred, the third linear regulator 323 or the fourth linear regulator 325 may regulate the same and may then provide the second amplifier 321 with the seventh voltage or the eighth voltage.

According to an embodiment, the third linear regulator 323 or the fourth linear regulator 325 and the second amplifier 321 may be disposed inside the second communication chip 320, and the switching regulator 340 may be disposed outside the second communication chip 320. The third linear regulator 323 or the fourth linear regulator 325 may adjust the voltage output from the switching regulator 340 so as to correspond to the envelope of the second input signal, and may provide the same to the second amplifier 321. The first length (or distance) between the third linear regulator 323 or the fourth linear regulator 325 and the second amplifier 321 may be shorter than the second distance between the switching regulator 340 and the second amplifier 321. This may reduce the restriction resulting from the distance between the switching regulator 340 and the second amplifier 321.

According to an embodiment, the switching regulator 340 may be operably connected to the third linear regulator 323 and the fourth linear regulator 325. The switching regulator 340 may produce a low-frequency signal of power of the envelope of the second input signal input to the second amplifier 321. The switching regulator 340 may receive the envelope of the second input signal from the control circuit 330. According to an embodiment, the switching regulator 340 may provide different voltages to the third linear regulator 323 and the fourth linear regulator 325 according to the envelope. For example, the switching regulator 340 may provide the fifth voltage to the third linear regulator 323, and may simultaneously provide the sixth voltage to the fourth linear regulator 325.

According to an embodiment, the control circuit 330 may be configured to produce an envelope (for example, a second envelope) corresponding to the second input signal. The control circuit 330 may provide the produced envelope of the second input signal to at least one of the switching regulator 340, the third linear regulator 323, or the fourth linear regulator 325.

According to an embodiment, the control circuit 330 may control the third linear regulator 323 or the fourth linear regulator 325 to be used selectively according to the situation. The third linear regulator 323 or the fourth linear regulator 325, which may be designed to be optimized for the corresponding power (for example, the fifth voltage or the sixth voltage), may output power with a high efficiency with regard to each type of power. The control circuit 330 may control the envelope such that the third linear regulator 323 or the fourth linear regulator 325 is selectively driven according to the voltage of the envelope of the second input signal.

Figure 4A:
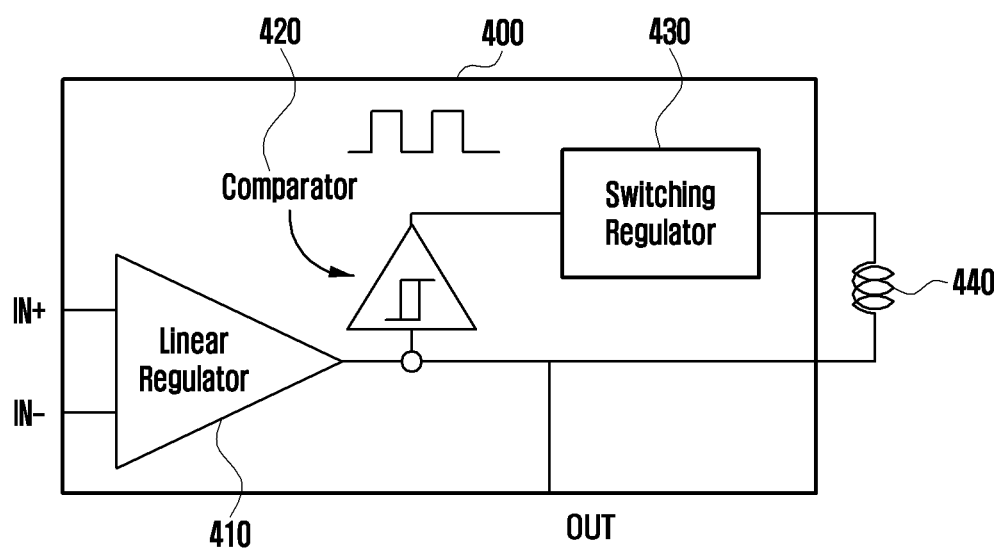
FIG. 4A is a diagram illustrating an example configuration of an ET modulator according to various embodiments.
Figure 4B:
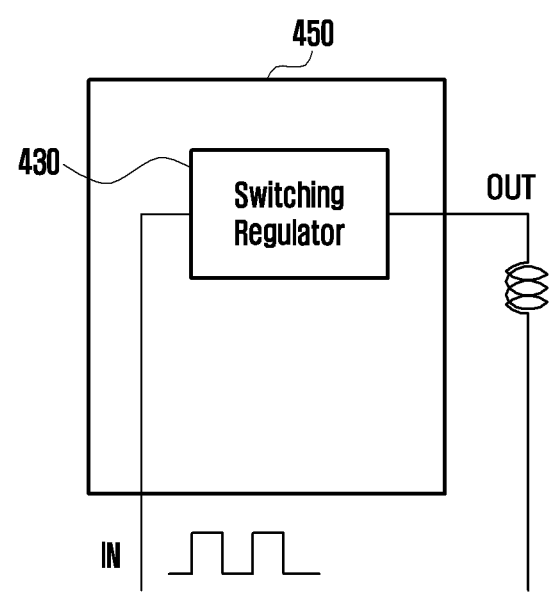
FIG. 4B is a diagram illustrating an example configuration of an ET modulator according to various embodiments.
Figure 4C:
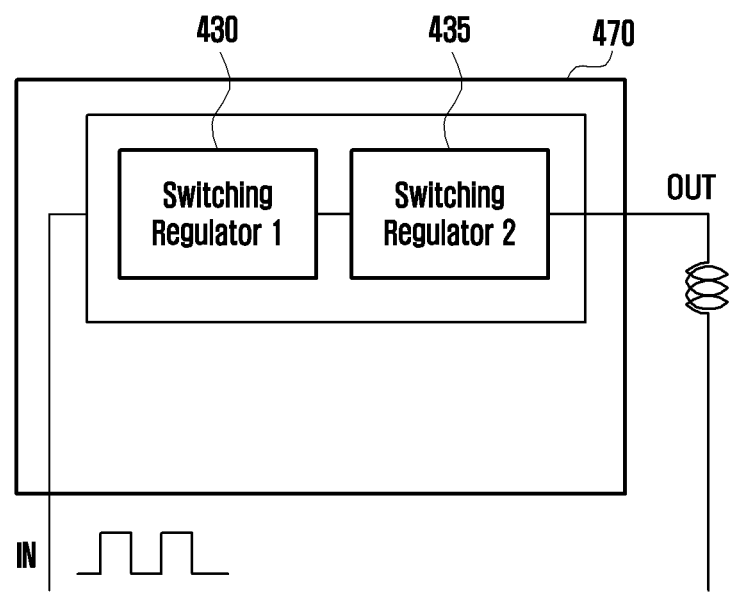
FIG. 4C is a diagram illustrating an example configuration of an ET modulator according to various embodiments.

FIG. 4A is a diagram illustrating an example configuration of an ET modulator according to various embodiments, FIG. 4B is a diagram illustrating an example configuration of an ET modulator according to various embodiments, and FIG. 4C is a diagram illustrating an example configuration of an ET modulator according to various embodiments.

FIG. 4A is a diagram illustrating an example configuration of an example ET modulator according to a comparative example.

Referring to FIG. 4A, the envelope-tracking (ET) modulator 400 may apply the envelope (or envelope signal) of an input signal (for example, a first input signal or a second input signal), which is applied to an amplifier (for example, the first amplifier 311 or the second amplifier 321 in FIG. 3A to FIG. 3C), as a power-supply voltage of the first amplifier 311 or the second amplifier 321. The ET modulator 400, configured as above, may include two different types of regulators (e.g., hybrid structure) in order to have high-efficiency and high-linearity characteristics. For example, the ET modulator 400 may include a linear regulator 410 and/or a switching regulator 430. The ET modulator 400 may further include a comparator 420 configured to compare outputs from the linear regulator 410 and to control inputs to the switching regulator 430. The ET modulator 400 in FIG. 4A may be referred to as a "first-type ET modulator".

The linear regulator 410 (for example, the first linear regulator 311 or the second linear regulator 321 in FIG. 3A to FIG. 3C), which controls (or adjusts) a voltage, may compare an output voltage and a reference voltage and may output a constant voltage. The linear regulator 410, configured as above, is designed to operate with a linear relation between input and output. The linear regulator 410 may produce a high-frequency signal of the voltage of the envelope of an input signal input to the first amplifier 311 or the second amplifier 321.

According to various embodiments, the linear regulator 410 may regulate and thus compensate for noise produced in the switching regulator 430. The linear regulator 410 may have high-speed characteristics and thus can track the envelope of a wide bandwidth, but may have a low efficiency (for example, a small amount of current output). Due to the high speed of the linear regulator 410 and the low speed of the switching regulator 430, the linear regulator 410 may operate as a master controlling the switching regulator 430, and the switching regulator 430 may operate as a slave.

The switching regulator 430 (for example, the switching regulator 340 in FIG. 3A to FIG. 3C), which adjusts (or controls) a voltage, is designed to supply a desired voltage while turning on or off a switch element (for example, a MOSFET). The switching regulator 430 may produce a low-frequency signal of the voltage of the envelope of an input signal input to an amplifier (for example, the first amplifier 311 or the second amplifier 321). For example, the switching regulator 430 may supply power from the input side to the output side by turning on the switch element until the output voltage reaches the desired voltage, and may turn off the switch element, if the output voltage reaches the desired voltage, thereby preventing waste of the input power.

For example, if the switching regulator 430 may turn on the switch element, power may be supplied to the output terminal OUT through an inductor 440, and if the switching regulator 430 turns off the switch element, power accumulated in the inductor 440 may be supplied to the output terminal. If the switch element is turned on, the output power may increase, and if the switch element is turned off, the output power may decrease. The switching regulator 430 may control the output power based on this principle. The switching regulator 430 may output a large amount of current (or voltage) (for example, high efficiency), and the lower speed thereof may impede tracking the envelope of a wide bandwidth. For this reason, the ET modulator 400 may include a linear regulator 410 and a switching regulator 430 (hybrid structure).

FIG. 4B is a diagram illustrating an example configuration of an example ET modulator according to various embodiments.

Referring to FIG. 4B, the ET modulator 450 may be designed to include only a switching regulator 430. If the ET modulator 450 is included in an electronic device (for example, the electronic device 101 in FIG. 1), a linear regulator 410 may be included in a communication chip (for example, the first communication chip 310 or the second communication chip 320 in FIG. 3A to FIG. 3C). The ET modulator 450 in FIG. 4B may be referred to as a "second-type ET modulator". Although not illustrated, the switching regulator 430 may be connected to the power management module 180 in FIG. 1. The switching regulator 430 may make a single input (for example, an input from the power management module 180) and/or multiple outputs (for example, outputs to the first linear regulator 313 and the second linear regulator 315, respectively). The switching regulator 430 may provide a first voltage to the first linear regulator 313 and may provide a second voltage to the second linear regulator 315.

FIG. 4C is a diagram illustrating an example configuration of an example ET modulator according to various embodiments.

Referring to FIG. 4C, the ET modulator 470 may be designed to include multiple switching regulators. For example, the ET modulator 470 may include a first switching regulator 430 or a second switching regulator 435. If the ET modulator 470 is included in an electronic device (for example, the electronic device 101 in FIG. 1), a first linear regulator 313 and a second linear regulator 315 may be included in a communication chip (for example, the first communication chip 310 in FIG. 3A to FIG. 3C). The first switching regulator 430 may provide a first voltage to the first linear regulator 313, and the second switching regulator 435 may provide a second voltage to the second linear regulator 315.

The ET modulator 470 in FIG. 4C may be referred to as a "second-type ET modulator". Although the ET modulator 470 is illustrated in FIG. 4C as including two switching regulators, the same may include more than two (for example, three or four) switching regulators.

Figure 5A:
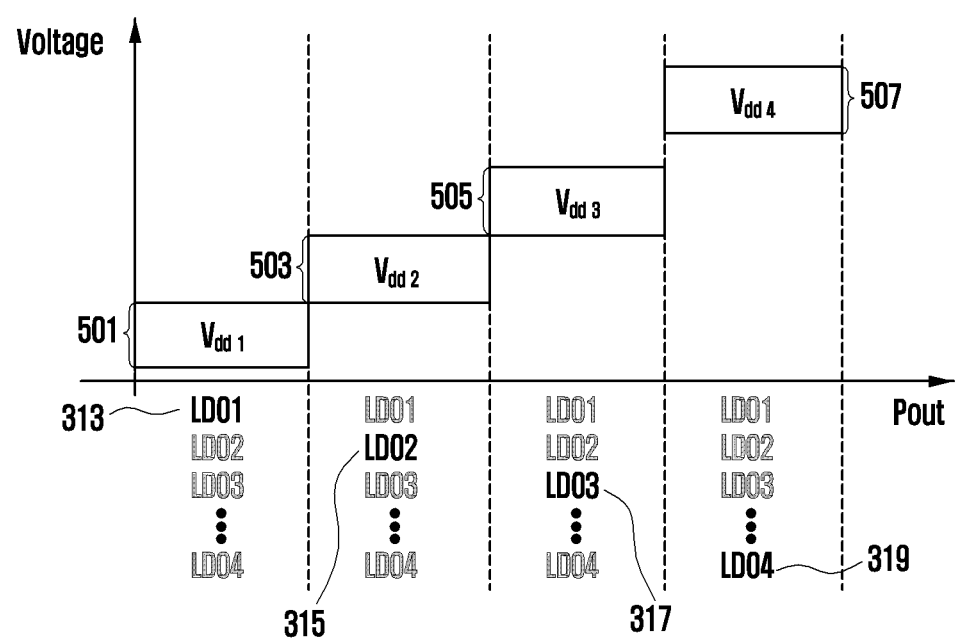
FIG. 5A is a diagram illustrating an example of driving multiple linear regulators according to various embodiments.

FIG. 5A is a diagram illustrating an example of driving multiple linear regulators according to various embodiments.

Referring to FIG. 5A, according to an embodiment, is an example 510 of driving linear regulators, if the voltage of the envelope of a first input signal input to a first amplifier (for example, the first amplifier 311 in FIG. 3A to FIG. 3C) is in a first range 501, a first linear regulator LDO1 313 may operate. The first linear regulator LDO1 313 may provide a third voltage to the first amplifier using a first voltage Vdd1 supplied from a switching regulator (for example, the switching regulator 340 in FIG. 3A to FIG. 3C). For example, the third voltage may be equal to or higher than the first voltage.

According to an embodiment, if the voltage of the envelope of the first input signal is in a second range 503, a second linear regulator 315 LDO2 may operate. The second linear regulator 315 LDO2 may provide a fourth voltage to the first amplifier 311 using a second voltage Vdd2 supplied from the switching regulator 340. For example, the fourth voltage may be equal to or higher than the second voltage. The second range 503 may include values larger than values included in the first range 501. For example, the first range 501 may be 1.2-1.49V, and the second range 503 may be 1.5-1.79V.

According to an embodiment, if the voltage of the envelope of the first input signal is in a third range 505, a third linear regulator 317 LDO3 may operate. The third linear regulator 317 LDO3 may provide a seventh voltage to the first amplifier 311 using a fifth voltage Vdd3 supplied from the switching regulator 340. For example, the seventh voltage may be equal to or higher than the fifth voltage.

According to an embodiment, if the voltage of the envelope of the first input signal is in a fourth range 507, a fourth linear regulator 319 LDO4 may operate. The fourth linear regulator 319 LDO4 may provide an eighth voltage to the first amplifier 311 using a sixth voltage Vdd4 supplied from the switching regulator 340. For example, the eighth voltage may be equal to or higher than the sixth voltage. The fourth range 507 may include values larger than values included in the third range 505. For example, the third range 505 may be 1.8-2.09V, and the fourth range 507 may be 2.1-2.4V.

Although the diagram illustrates four linear regulators, the number of included linear regulators may be less than or greater than four. The diagram is only an example, and does not limit the disclosure.

Figure 5B:
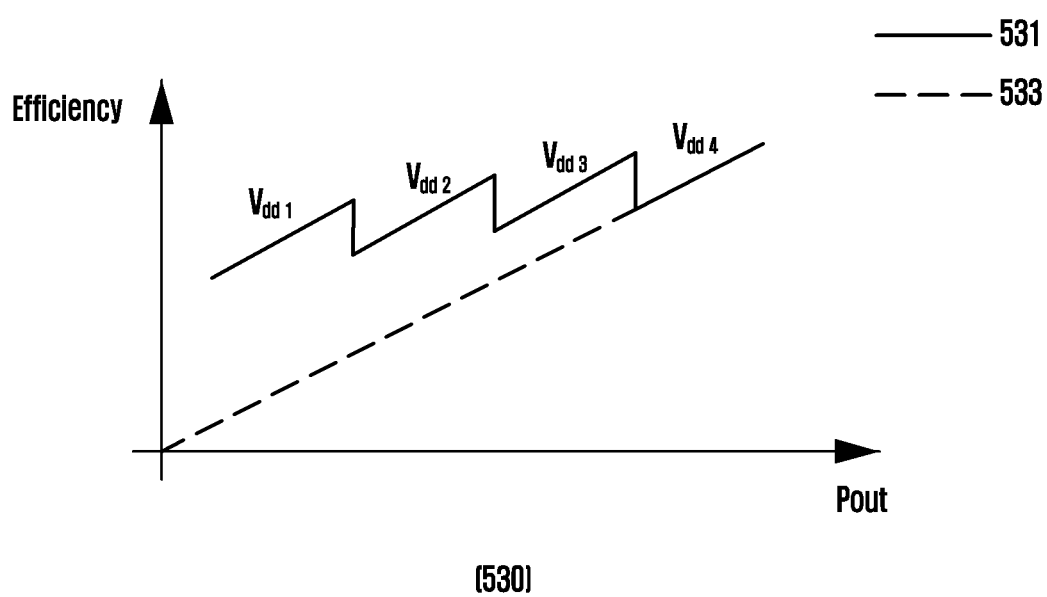
FIG. 5B is a graph illustrating the efficiency of using multiple linear regulators according to various embodiments.

FIG. 5B is a diagram illustrating the efficiency of using multiple linear regulators according to various embodiments.

Referring to FIG. 5B, the efficiency graph 530 shows a first output vs. efficiency 531 in the case of using multiple linear regulators providing different voltages and a second output vs. efficiency 533 in the case of using a single regulator. It is clear that the second output vs. efficiency 533 increases in proportion to the output power (for example, output), and is low if the output power is low. According to various embodiments, multiple linear regulators may be configured (or designed) to operate in high-efficiency sections so as to correspond to respective voltages (for example, Vdd1, Vdd2, Vdd3, Vdd4) based on the first output vs. efficiency 531.

Figure 6A:
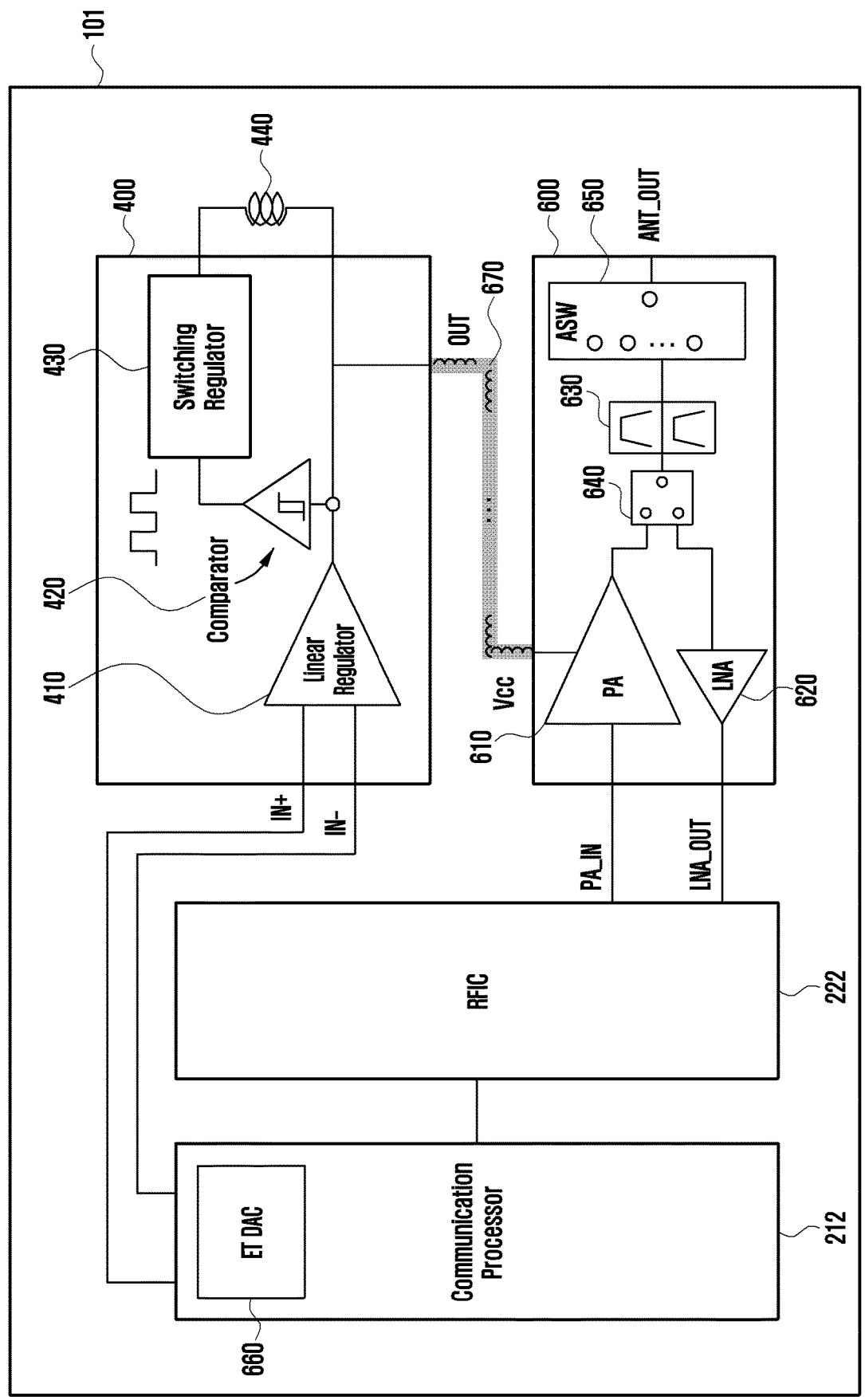
FIG. 6A is a diagram illustrating an example configuration of an electronic device, to which an ET modulator is applied, according to a various embodiments.

FIG. 6A is a diagram illustrating an example configuration of an example electronic device, to which an ET modulator is applied, according to a comparative example.

Referring to FIG. 6A, the electronic device according to a comparative example (for example, electronic device 101 in FIG. 1) may include a communication processor (for example, first communication processor 212), an RFIC (for example, the first RFIC 222 in FIG. 2), an ET modulator 400, and/or a communication chip 600.

The communication processor 212 may include various communication processing circuitry and establish a communication channel in a band to be used for wireless communication with a network (for example, the second network 199 in FIG. 1), and may support network communication through the established communication channel. According to various embodiments, the network may be a legacy network including a 2G, 3G, 4G, or long term revolution (LTE) network. The communication processor 212 may include an envelope-tracking digital-analog converter (ET DAC) 660.

The ET DAC 660 may include an envelope detector and a digital signal processor (DSP). The envelope detector may convert an in-phase/quadrature-phase (I/Q) signal into an envelope signal (or envelope). The I/Q signal may refer to a signal having a modulated frequency. The DSP may adjust the shaping or delay of the envelope signal output from the envelope detector. An amplifier produces a third-order intermodulation distortion (IMD3) during signal amplification, and the IMD3 may have a sweet spot point. The shaping may refer to controlling the envelope signal by tracking a sweet spot. The DSP may control the envelope signal such that the envelope signal tracks a radio-frequency signal amplified by the communication chip 600. According to various embodiments, the ET DAC 660 is illustrated in the diagram as being included in the communication processor 212, but may be included in the RFIC 222.

The RFIC 222 may convert, during transmission, a baseband signal produced by the communication processor 212 into a radio-frequency signal used for the network (for example, in a frequency band of about 600 MHz to about 6 GHz).

The ET modulator 400 may include a linear regulator 410, a comparator 420, and/or a switching regulator 430. The ET modulator 400 may be the first-type ET modulator illustrated in FIG. 4A. The linear regulator 410 (for example, the first linear regulator 311 or the second linear regulator 321 in FIG. 3A to FIG. 3C), the comparator 420, or the switching regulator 430 (for example, the switching regulator 340 in FIG. 3A to FIG. 3C) has been described in detail with reference to FIG. 3A to FIG. 3C or FIG. 4A to FIG. 4C, and detailed descriptions thereof may not be repeated here. The ET modulator 400 may provide the amplifier 610 with an output corresponding to the sum of an output from the linear regulator 410 and an output from the switching regulator 430.

The communication chip 600 may include a power amplifier (PA) 610, a low-noise amplifier (LNA) 620, a filter/duplexer 630, a mobile industry processor interface (MIPI) controller 640, and an antenna switch (ASW) 650. The PA 610 (for example, the first amplifier 311 or the second amplifier 321 in FIG. 3A to FIG. 3C) may amplify an input signal. For example, the PA 610 may receive an input signal (for example, PA_IN) from the RFIC 222 and may amplify the input signal, thereby outputting (or producing) a radio-frequency signal (for example, transmission signal). The LNA 620 may amplify a radio-frequency signal (for example, reception signal) received through an antenna (for example, the first antenna module 242 in FIG. 2).

The LNA 620 may amplify the radio-frequency signal and may output (for example, LNA_OUT) the same to the RFIC 222. The filter/duplexer 630 may be connected to the first antenna module 242 so as to separate transmission and reception frequencies of the electronic device 101. The filter/duplexer 630 may include multiple filters or duplexers with regard to respective frequency bands. The MIPI controller 640 may control a transmission signal or a reception signal. The MIPI controller 640 may be made of a switch module such that, when a transmission signal is transmitted, the filter/duplexer 630 is controlled (for example, MIPI #1) to be connected to the amplifier 610 and, when a reception signal is received, the filter/duplexer 630 is controlled (for example, MIPI #2) to be connected to the LNA 620. The ASW 650 may select the frequency band of a signal to be transmitted/received. The ASW 650 may control a switch so as to conform to the frequency band of the signal to be transmitted/received.

Since an envelope signal output from the ET DAC 660 is input to the ET modulator 400, distortion of the envelope signal input to the ET modulator 400 may worsen. The signal distortion may worsen in proportion to the distance 670 (for example, distance between the ET modulator 400 and the communication chip 600), or in proportion to the bandwidth of the signal. Therefore, the ET modulator 400 according to the comparative example may be amounted at as small a distance 670 from the communication chip 600 as possible. If the ET technology is applied to a signal having a wide bandwidth equal to/larger than 100 MHz (for example, 5G), distortion may occur due to the distance 670 between the ET modulator 400 and the communication chip 600.

Figure 6B:
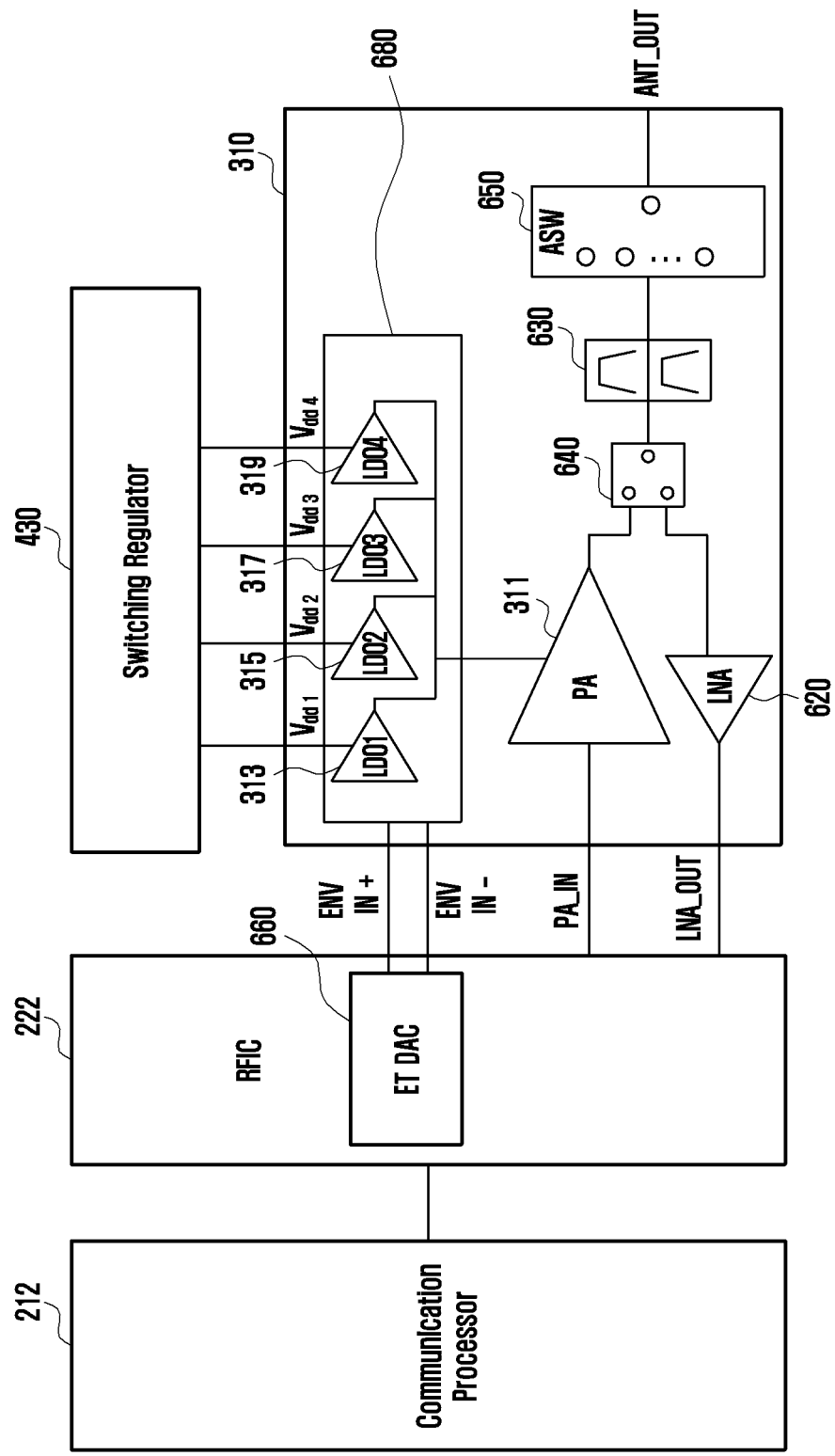
FIG. 6B is a diagram illustrating an example configuration of an electronic device including multiple linear regulators in a communication chip according to various embodiments.

FIG. 6B is a diagram illustrating an example configuration of an example electronic device, to which an ET modulator is applied, according to various embodiments.

Referring to FIG. 6B, the electronic device according to the disclosure (for example, electronic device 101 in FIG. 1) may include a communication processor (for example, first communication processor 212), an RFIC (for example, the RFIC 222 in FIG. 2), a switching regulator 430, and/or a first communication chip 310 (for example, the first communication chip 310 in FIG. 3A to FIG. 3C).

The communication processor 212 and the RFIC 222 have been described in detail with reference to FIG. 6A, and repeated descriptions may not be repeated here.

According to an embodiment, the RFIC 222 may include an ET DAC 660. The ET DAC 660 may produce an envelope (or an envelope signal) based on an input signal input to the first amplifier included in the first communication chip 310 (for example, the first amplifier 311 or the second amplifier 321 in FIG. 3A to FIG. 3C). The ET DAC 660 may provide the produced envelope to a first linear regulator 313 LDO1 to a fourth linear regulator 319 LDO4 (e.g., linear regulators 313, 315, 317 and 319). Although the ET DAC 660 is illustrated in FIG. 6B as being included in the RFIC 222, the ET DAC 660 may be included inside the first communication chip 310. Although the diagram illustrates four linear regulators included, the number of included linear regulators may be greater than or less than four. This is only an example, and does not limit the disclosure.

According to an embodiment, the switching regulator 430 may refer, for example, to an ET modulator including a switching regulator, and may be the second-type ET modulator illustrated in FIG. 4B or FIG. 4C. According to various embodiments, the switching regulator 430 may be configured to include a single switching regulator 430 as in FIG. 4B, or may be configured to include multiple switching regulators as in FIG. 4C (for example, a first switching regulator 430 and a second switching regulator 435). According to various embodiments, the switching regulator 430 may include four switching regulators, the number of which corresponds to the number of linear regulators included in the first communication chip 310.

According to an embodiment, the switching regulator 430 may be operably connected to the first linear regulator 313 LDO1, the second linear regulator 315 LDO2, the third linear regulator 317 LDO3, and/or the fourth linear regulator 319 LDO4. According to an embodiment, using a voltage supplied from the power management module 188 in FIG. 1, the switching regulator 430 may provide different voltages to the first linear regulator 313, the second linear regulator 315, the third linear regulator 317, and/or the fourth linear regulator 319. For example, the switching regulator 430 may provide a first voltage to the first linear regulator 313, may provide a second voltage to the second linear regulator 315, may provide a fifth voltage to the third linear regulator 317, and may provide a sixth voltage to the fourth linear regulator 319. The switching regulator 430 has been described in detail with reference to FIG. 3A to FIG. 3C or FIG. 4A to FIG. 4C, and repeated descriptions thereof may not be repeated here.

According to an embodiment, the first communication chip 310 may include a first amplifier 311, a first linear regulator 313 LDO1, a second linear regulator 315 LDO2, a third linear regulator 317 LDO3, a fourth linear regulator 319 LDO4, a low-noise amplifier 620, a filter/duplexer 630, an MIPI controller 640, or an antenna switch (ASW) 650.

According to an embodiment, the first linear regulator 313 may provide a third voltage to the first amplifier 311 using a first voltage supplied from the switching regulator 430. The first linear regulator 313 may be designed to operate if the voltage of the envelope of a first input signal (for example, PA_IN) input from the RFIC 222 to the first amplifier 311 corresponds to a first range. The second linear regulator 315 may provide a fourth voltage to the first amplifier 311 using a second voltage supplied from the switching regulator 430. The second linear regulator 315 may be designed to operate if the voltage of the envelope of the first input signal corresponds to a second range.

According to an embodiment, the third linear regulator 317 may provide a seventh voltage to the first amplifier 311 using a fifth voltage supplied from the switching regulator 430. The third linear regulator 317 may be designed to operate if the voltage of the envelope of the first input signal corresponds to a third range. The fourth linear regulator 319 may provide an eighth voltage to the first amplifier 311 using a sixth voltage supplied from the switching regulator 430. The fourth linear regulator 319 may be designed to operate if the voltage of the envelope of the first input signal corresponds to a fourth range.

According to an embodiment, values in the second range (for example, 1.5-1.79V) may be greater than values in the first range (for example, 1-1.49V), values in the third range (for example, 1.8-2.1V) may be greater than values in the second range, and values in the fourth range (for example, 2.11V) may be greater than values in the third range.

According to various embodiments, if the voltage of the envelope of the first input signal is a value between the second range and the third range, the second linear regulator 315 may be driven, and the third linear regulator 317 may not be driven. In an embodiment, if the voltage of the envelope of the first input signal is a value between the second range and the third range, the second linear regulator 315 may be not driven, and the third linear regulator 317 may be driven. As another example, if a threshold value is set between the second range and the third range such that the voltage of the envelope of the first input signal is equal to/lower than the threshold value, the second linear regulator 315 may be driven, and if the voltage exceeds the threshold value, the third linear regulator 317 may be driven.

In an embodiment, if the voltage of the envelope of the first input signal is a value between the third range and the fourth range (for example, 1.95-2.03V), the third linear regulator 317 may be driven, and the fourth linear regulator 319 may not be driven. As another example, if a threshold value is set between the third range and the fourth range such that the voltage of the envelope of the first input signal is equal to/lower than the threshold value, the third linear regulator 317 may be driven, and if the voltage exceeds the threshold value, the fourth linear regulator 319 may be driven.

According to various embodiments, the switching regulator 430 may output a relatively large voltage, but the low speed thereof may make it difficult to track the envelope of a wide bandwidth. Multiple linear regulators 680 may output a relatively small voltage, but the high speed thereof may make it easy to track the envelope of a wide bandwidth.

A comparison between FIG. 6A and FIG. 6B illustrates that a linear regulator 410 may be included outside the communication chip 600 in FIG. 6A, and multiple linear regulators 680 may be included inside the first communication chip 310 in FIG. 6B. In FIG. 6A, an output (for example, 1.51V) of the ET modulator 400, which corresponds to the sum of an output (for example, 0.1V) of the linear regulator 410 and an output (for example, 1.5V) of the switching regulator 430, may be input to the amplifier 610. In FIG. 6B, using an output (for example, 1.5V) received from the switching regulator 430, the multiple linear regulators 680 may finally provide an output (for example, 1.51V) to the first amplifier 311.

Signal distortion may be less severe when a voltage is provided to the first amplifier 311 from inside the first communication chip 310 than when a voltage is provided to the amplifier 610 from outside the first communication chip 310 as in FIG. 6A. Since multiple linear regulators 680 provide the final voltage with regard to a signal having a wide bandwidth equal to/larger than about 100 MHz (for example, as in 5G), signal distortion may be less severe than when a voltage is provided to the amplifier 610 from outside the first communication chip 310.

In addition, providing a wide range of voltage using multiple linear regulators 680 as in FIG. 6B may be more efficient than providing a wide range of voltage (for example, 1.0-2.5V) using one linear regulator 410 as in FIG. 6A. For example, in the case of FIG. 6A, the switching regulator 430 and the linear regulator 410 continuously operate to output a voltage corresponding to the envelope. However, in the case of FIG. 6B, the first linear regulator 313 may operate if the voltage of the envelope corresponds to a first range, the second linear regulator 315 may operate if the voltage of the envelope corresponds to a second range, the third linear regulator 317 may operate if the voltage of the envelope corresponds to a third range, and the fourth linear regulator 319 may operate if the voltage of the envelope corresponds to a fourth range. The efficiency may be higher, since each linear regulator operates to output an optimal voltage in each range, than when a wide range of voltage is output using one linear regulator. Providing an optimal voltage corresponding to the envelope may finally help reducing power consumed by the amplifier.

According to various embodiments, the first amplifier 311, the low-noise amplifier 620, the filter/duplexer 630, the MIPI controller 640, or the antenna switch (ASW) 650, which is included in the first communication chip 310, may use a complementary metal-oxide-semiconductor (CMOS)/ silicon-on-insulator (SOI) wafer process. As another example, the ET modulator including the linear regulator 313 and the switching regulator 430 may also use the CMOS/SOI wafer process. Therefore, if the linear regulator 313, which is one of the components of the ET modulator, is included in the first communication chip 310, there may be no chip size change, and chip manufacturing may be facilitated.

Figure 6C:
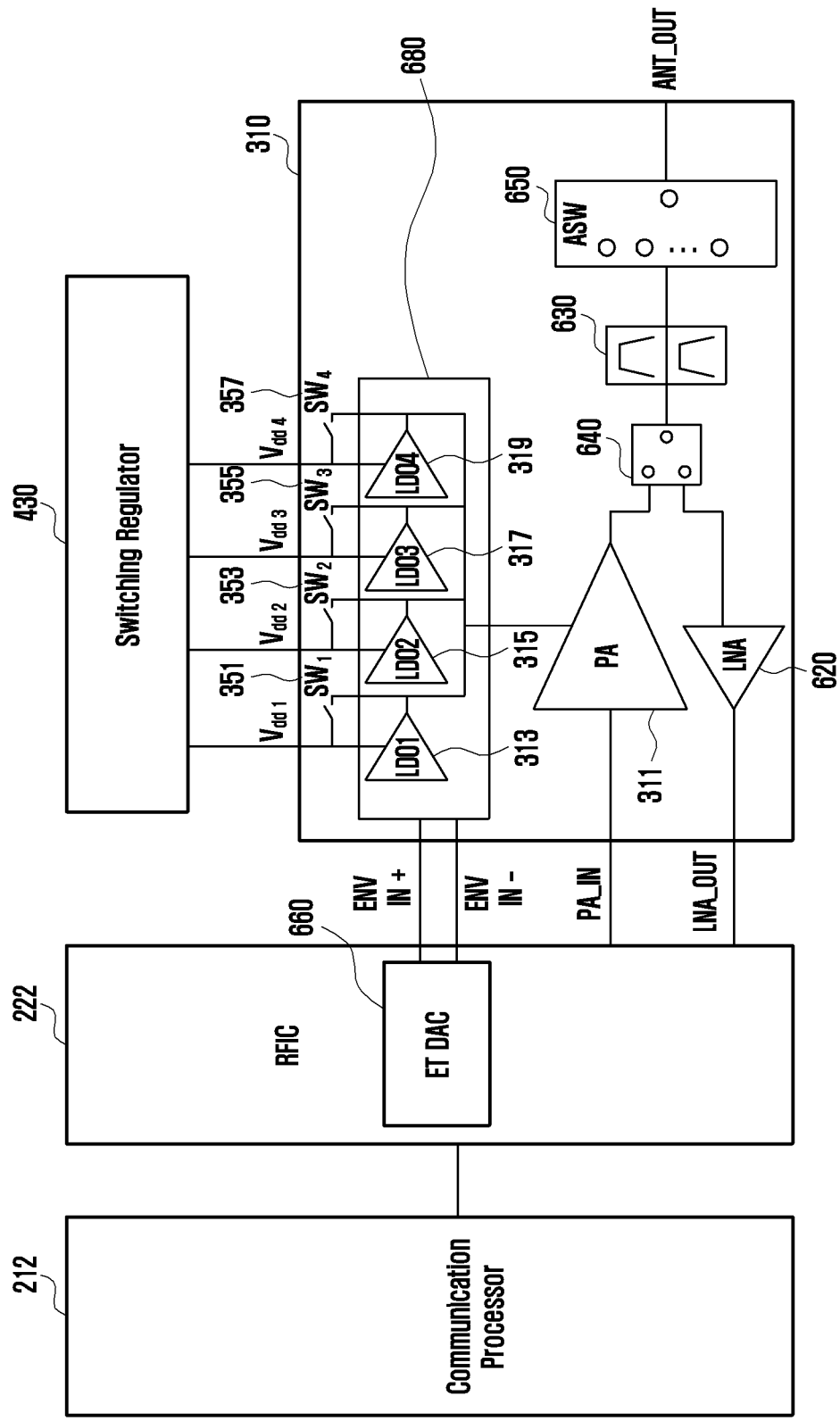
FIG. 6C is a diagram illustrating an example configuration of an electronic device including multiple linear regulators and multiple switches in a communication chip according to various embodiments.

FIG. 6C is a diagram illustrating an example configuration of an example electronic device, to which an ET modulator is applied, according to various embodiments.

Referring to FIG. 6C, the electronic device according to the disclosure (for example, electronic device 101 in FIG. 1) may include a communication processor (for example, first communication processor 212), an RFIC (for example, the RFIC 222 in FIG. 2), a switching regulator 430, and/or a first communication chip 310 (for example, the first communication chip 310 in FIG. 3A to FIG. 3C).

The communication processor 212 and the RFIC 222 have been described in detail with reference to FIG. 6A or FIG. 6B, and repeated descriptions may not be repeated here.

According to an embodiment, the switching regulator 430 refers to an ET modulator including a switching regulator, and may be the second-type ET modulator illustrated in FIG. 4B or FIG. 4C. The switching regulator 430 may be operably connected to a first linear regulator 313 LDO1, a second linear regulator 315 LDO2, a third linear regulator 317 LDO3, and/or a fourth linear regulator 319 LDO4. The switching regulator 430 is substantially the same as described in detail with reference to FIG. 3A to FIG. 3C or FIG. 4A to FIG. 4C, and repeated descriptions thereof may not be repeated here.

The first communication chip 310 may include an amplifier 311 (for example, the first amplifier 311 or the second amplifier 321 in FIG. 3A to FIG. 3C), multiple linear regulators 680 (for example, a first linear regulator 313 LDO1, a second linear regulator 315 LDO2, a third linear regulator 317 LDO3, and a fourth linear regulator 319 LDO4), a first switch 351, a second switch 353, a third switch 355, a fourth switch 357, a low-noise amplifier 620, a filter/duplexer 630, an MIPI controller 640, or an antenna switch (ASW) 650.

According to various embodiments, although the ET DAC 660 is illustrated in FIG. 6C as being included in the RFIC 222, the ET DAC 660 may be included in the first communication chip 310. For example, the ET DAC 660 may refer to the control circuit 330 in FIG. 3A to FIG. 3C. The ET DAC 660 may control the first switch 351, the second switch 353, the third switch 355, or the fourth switch 357 such that one of the ET technology, the APT technology, or the SPT technology is applied to the first amplifier 311. If it is difficult to secure a high-efficiency dynamic range of multiple linear regulators 680, the ET DAC 660 may control the output voltage of the switching regulator 430 to be directly input to the first amplifier 311.

For example, the ET DAC 660 may control the third switch 355 or the fourth switch 357 such that a voltage supplied from the switching regulator 340 is controlled to be supplied to the first amplifier 311 with no change. For example, if the input signal corresponds to a third code value stored in the signal control table, the ET DAC 660 may turn on the third switch 355 such that a voltage (for example, a fifth voltage) supplied from the switching regulator 340 to the third linear regulator 317 is controlled to be supplied to the first amplifier 311 with no change. If the third switch 355 is turned on, the third linear regulator 317 may not operate. The ET DAC 660 may turn off the third switch 355 such that the fifth voltage output from the switching regulator 340 is controlled to be provided to the third linear regulator 317. If the envelope of the input signal is in a third range, the third linear regulator 317 may provide a seventh voltage to the first amplifier 311 using the fifth voltage.

If the input signal corresponds to a fourth code value stored in the signal control table, the ET DAC 660 may turn on the fourth switch 357 such that a voltage (for example, a sixth voltage) supplied from the switching regulator 340 to the fourth linear regulator 319 is controlled to be supplied to the first amplifier 311 with no change. If the fourth switch 357 is turned on, the fourth linear regulator 319 may not operate. The ET DAC 660 may turn off the fourth switch 357 such that the sixth voltage output from the switching regulator 340 is controlled to be provided to the fourth linear regulator 319. If the envelope of the input signal is in a fourth range, the fourth linear regulator 319 may provide an eighth voltage to the first amplifier 311 using the sixth voltage.

Figure 7A:
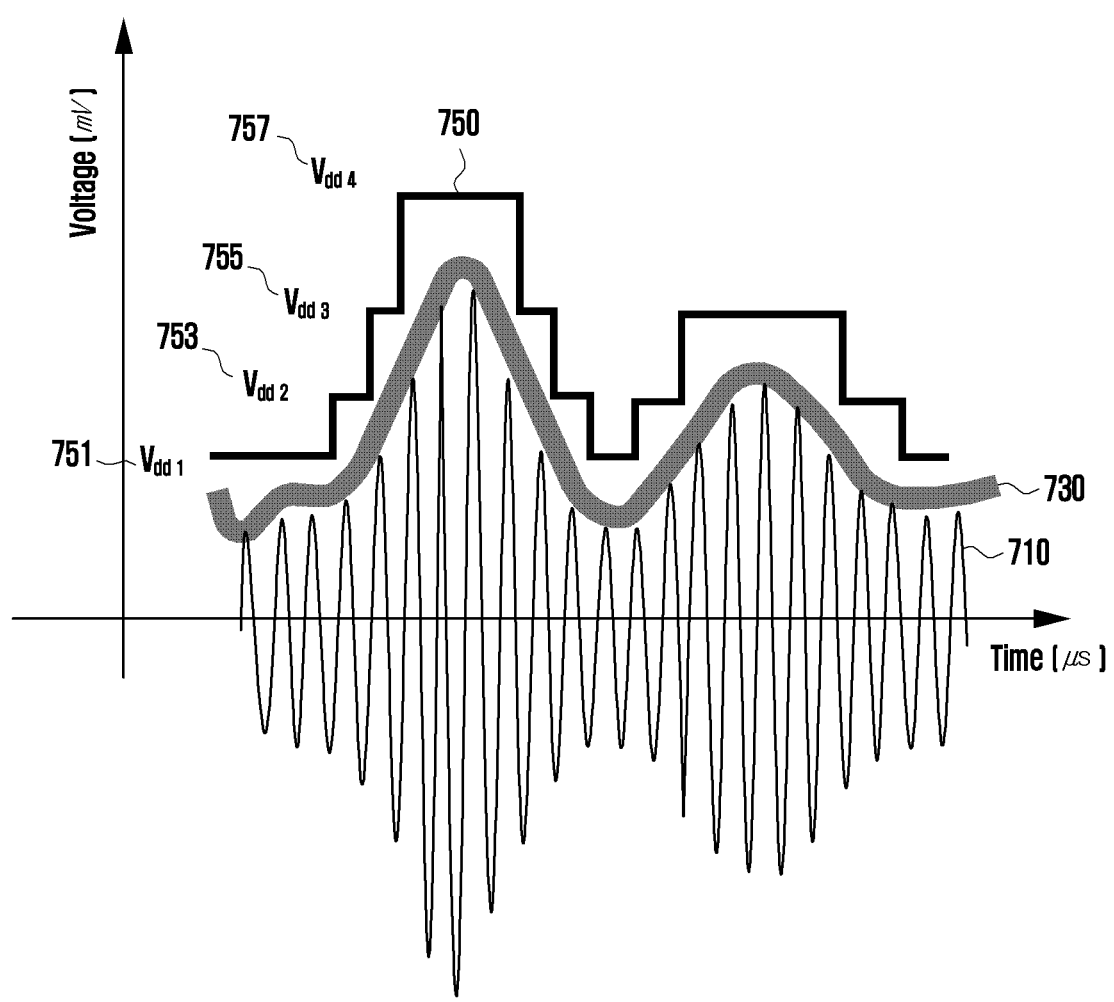
FIG. 7A is a voltage measurement graph based on simulation of an ET modulator according to various embodiments.
Figure 7B:
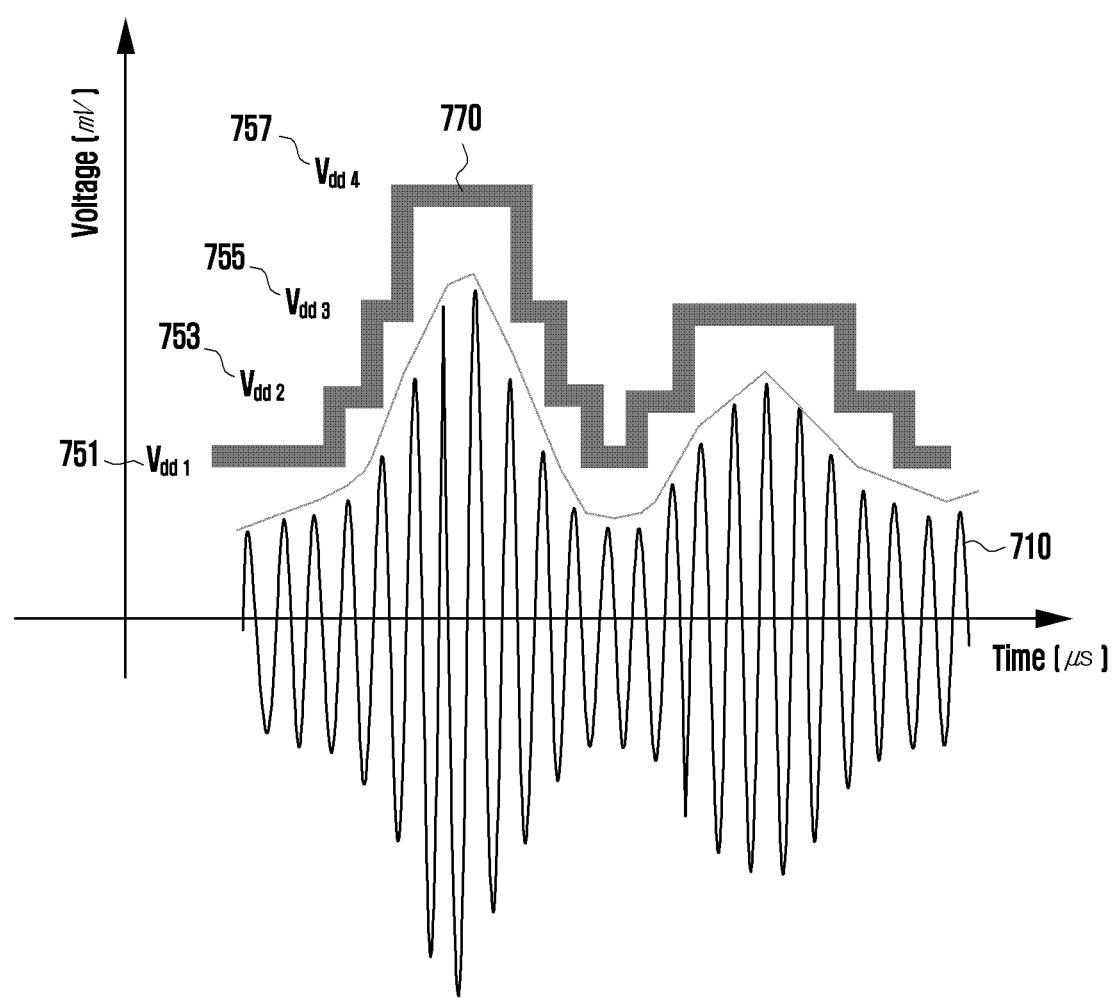
FIG. 7B is a voltage measurement graph based on simulation of an ET modulator according to various embodiments.

FIG. 7A is a voltage measurement graph based on simulation of an ET modulator according to various embodiments, and FIG. 7B is a voltage measurement graph based on simulation of an ET modulator according to various embodiments.

FIG. 7A is a voltage measurement graph based on simulation of an ET modulator.

Referring to FIG. 7A, the first voltage measurement graph shows an input signal 710, an envelope signal 730, or a power-supply signal 750 input to a linear regulator. The input signal 710, which is produced by a communication processor (for example, the first communication processor 212 in FIG. 2) in connection with communication (for example, wireless communication), may be input to an amplifier (for example, the first amplifier 311 in FIG. 3A to FIG. 3C) via an RFIC (for example, the first RFIC 222 or the second RFIC 224 in FIG. 2). The first amplifier 311 may amplify the input signal 710 and may thereby output a radio-frequency signal.

The envelope signal 730 may be a signal produced by a control circuit (for example, the control circuit 330 in FIG. 3A to FIG. 3C, or an ET DAC 660) based on the input signal 710. The control circuit 330 may provide the produced envelope signal 730 to a first linear regulator (for example, the first linear regulator 313 in FIG. 3A to FIG. 3C) or a second linear regulator (for example, the second linear regulator 315 in FIG. 3A to FIG. 3C) included in a communication chip (for example, the first communication chip 310 or the second communication chip 320 in FIG. 3A to FIG. 3C).

The power-supply signal 750 may be a voltage (or a signal) provided from a switching regulator (for example, the switching regulator 340 in FIG. 3A to FIG. 3C) disposed outside the first communication chip 310 to the first linear regulator 313 to the fourth linear regulator 319 included in the first communication chip 310. For example, if the voltage of the envelope signal 730 of the input signal 710 corresponds to a first range (for example, Vdd1-Vdd2), the first linear regulator 313 may output a third voltage according to the envelope signal 730 using a first voltage 751 received from the switching regulator 340. If the voltage of the envelope signal 730 of the input signal 710 corresponds to a second range (for example, Vdd2-Vdd3), the second linear regulator 315 may output a fourth voltage according to the envelope signal 730 using a second voltage 753 received from the switching regulator 340.

If the voltage of the envelope signal 730 of the input signal 710 corresponds to a third range (for example, Vdd3-Vdd4), the third linear regulator 317 may output a seventh voltage according to the envelope signal 730 using a fifth voltage 755 received from the switching regulator 340. If the voltage of the envelope signal 730 of the input signal 710 corresponds to a fourth range (for example, Vdd4-), the third linear regulator 317 may output an eighth voltage according to the envelope signal 730 using a sixth voltage 757 received from the switching regulator 340. The third voltage, the fourth voltage, the seventh voltage, or the eighth voltage may refer to a power supply provided to the first amplifier 311. The first amplifier 311 may amplify the input signal 710 using a voltage output from a linear regulator. The third voltage, the fourth voltage, the seventh voltage, or the eighth voltage may correspond to the envelope signal 730.

FIG. 7B is a voltage measurement graph based on simulation of an ET modulator.

Referring to FIG. 7B, the second voltage measurement graph shows an input signal 710 and a signal 770 input, as a power supply, to a first amplifier 311. A control circuit 330 may control a first switch (for example, the first switch 351 in FIG. 3C) or a second switch (for example, the second switch 353 in FIG. 3C) such that the APT technology or the SPT technology is applied to the first amplifier 311. The control circuit 330 may control an output voltage of a switching regulator 340 to be input to the first amplifier 311 with no change. For example, the control circuit 330 may turn on the first switch 351 so as to supply a first voltage 751 from the switching regulator 340 to the first amplifier 311, may turn on the second switch 353 so as to supply a second voltage 753 from the switching regulator 340 to the first amplifier 311, may turn on the third switch 355 so as to supply a fifth voltage 755 from the switching regulator 340 to the first amplifier 311, and may turn on the fourth switch 357 so as to supply a sixth voltage 757 from the switching regulator 340 to the first amplifier 311.

According to an embodiment, an antenna capable of transmitting or receiving signals may be included in an electronic device (for example, the electronic device 101 in FIG. 1). For example, the electronic device may generally transmit an RF signal to a base station using an antenna at the lower end thereof. However, in order to increase the uplink throughput (T-put) or an uplink carrier aggregation (ULCA) technology or an evolved universal terrestrial radio access (UTRA) new radio (NR) dual connectivity (ENDC) technology may be applied to the electronic device 101. As such, in order to simultaneously transmit two or more independent RF signals, the electronic device 101 may use a first antenna (for example, the first antenna module 241 in FIG. 2) or a second antenna (for example, the second antenna module 244 in FIG. 2). According to an embodiment, multiple RF signals may be transmitted using only the first antenna, but parasitic components, such as intermodulation distortion (IMD)/harmonic, may make it difficult to satisfy the 3GPP Spurious spec, and may cause sensitivity degradation. In an embodiment, the electronic device 101 may have an ET modulator and a communication chip disposed at various locations in the electronic device, as illustrated and described below in FIG. 8A, FIG. 8B, FIG. 9A, and FIG. 9B, for the purpose of multiple transmissions (Tx).

According to various embodiments, the first comparative example 810 and the second comparative example 910 in FIG. 8A, FIG. 8B, FIG. 9A, and FIG. 9B may refer to an electronic device including the ET modulator 400 illustrated in FIG. 4A. The first disposition structure 850 and the second disposition structure 950 in FIG. 8B and FIG. 9B may refer to an electronic device including the ET modulator 450 illustrated in FIG. 4B (or the ET modulator 470 illustrated in FIG. 4C) and the first communication chip 310 illustrated in FIG. 3B. FIG. 8A, FIG. 8B, FIG. 9A, and FIG. 9B may illustrate a structure in which an ET modulator and a communication chip are disposed when the user views the display of the electronic device 101 in FIG. 1 from the front, or when the user views the rear surface of the electronic device 101 (opposite to the display).

According to various embodiments, the first disposition structure 850 and the second disposition structure 950 can be implemented using a minimum number of ET modulators with no limit on the distance between the ET modulator and the communication chip, even in the case of a scenario in which ULCA/ENDC needs to be supported, without using multiple complicated first-type ET modulators for the electronic device, and use of a simple second-type ET modulator may have advantages in connection with the size, the mounting area, the unit price, the circuit disposition, or the degree of design freedom.

In the following description with reference to FIG. 8A, FIG. 8B, FIG. 9A, and FIG. 9B, the ET modulator 400 illustrated in FIG. 4A may be referred to as a "first-type ET modulator", and the ET modulator 450 illustrated in FIG. 4B may be referred to as a "second-type ET modulator". Similarly, the communication chip 600 in FIG. 6A may be referred to as a "first-type communication chip", and the first communication chip 310 in FIG. 3A may be referred to as a "second-type communication chip".

Figure 8A:
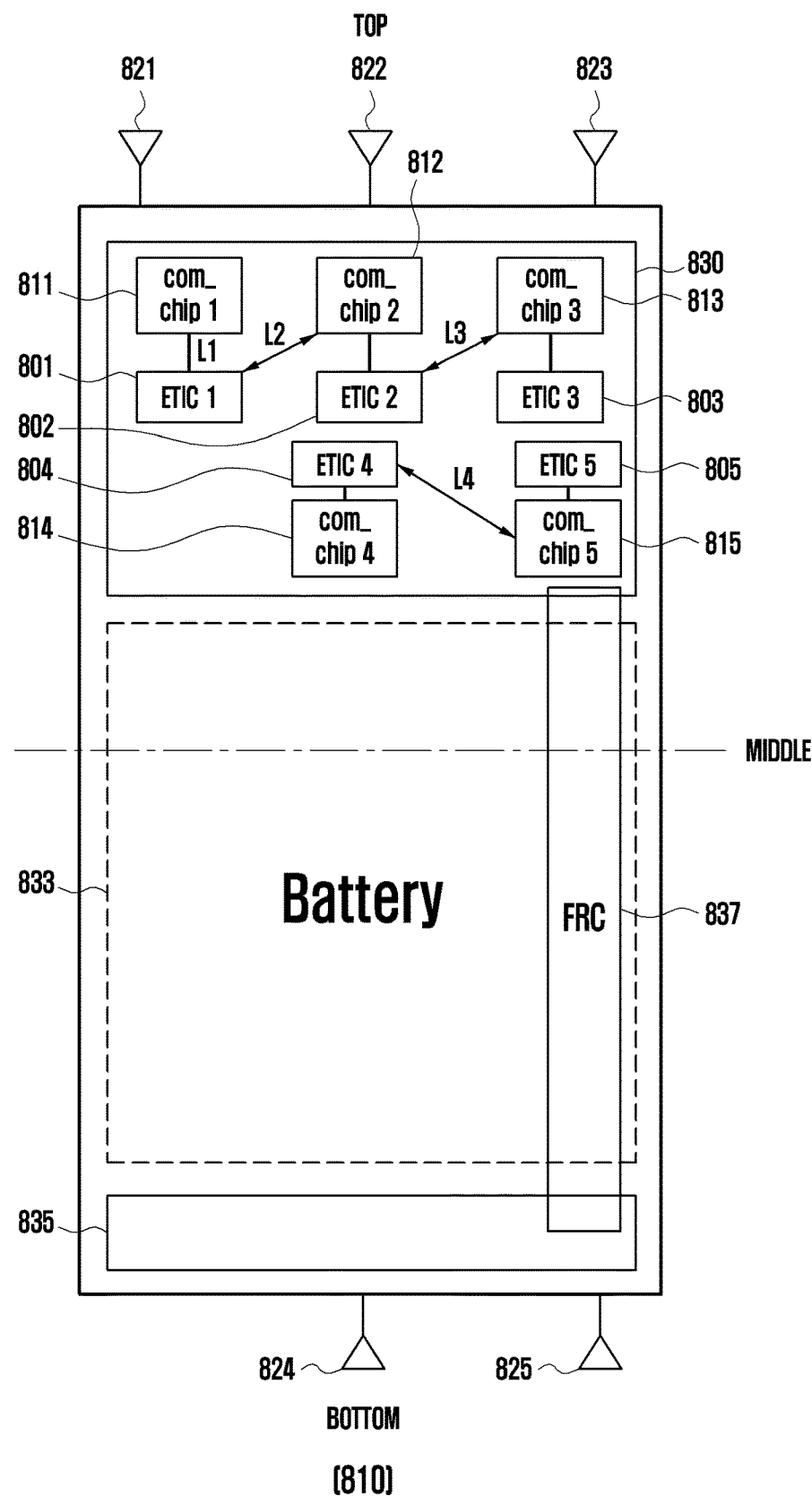
FIG. 8A is a diagram illustrating an example structure in which components included in an electronic device are disposed according to various embodiments.

FIG. 8A is a diagram illustrating an example structure in which components included in an electronic device are disposed according to a comparative example.

Referring to FIG. 8A, the first comparative example 810 may illustrate a structure in which, when the circuit board of an electronic device is implemented as a half board, a first-type ET modulator and a first-type communication chip are disposed inside the half board. For example, the half board may be a circuit board formed such that, when a surface (for example, front or rear surface) of an electronic is seen from above, the same can be disposed in approximately half the area of the electronic device. The first-type ET modulator may refer to the ET modulator 400 illustrated in FIG. 4A, and the first-type communication chip may refer to the communication chip 600 in FIG. 6A. The circuit board of the electronic device 101 may include a first substrate 830 and a second substrate 835 and may have a structure in which an FPCB-type RF cable (FRC) 837 connects the first substrate 830 and the second substrate 835. In addition, the electronic device may include a battery 833 between the first substrate 830 and the second substrate 835. For example, the first substrate 830 may be the main circuit board, and the second substrate 835 may be the sub circuit board. The first substrate 830 may have a first-type ET modulator and a first-type communication chip disposed thereon.

In connection with the first comparative example 810, if the electronic device 101 include multiple communication chips and five antennas connected to the multiple communication chips, the first-type ET modulator may be disposed so as to correspond to each communication chip. The first-type ET modulator may include, as in FIG. 4A, a linear regulator 410, a comparator 420, and a switching regulator 430. The first-type communication chip refers to the communication chip 600 in FIG. 6A, and may include at least one of the amplifier 610, the low-noise amplifier 620, the MIPI controller 640, the filter/duplexer 630, or the antenna switch (ASW) 650 illustrated in FIG. 6A.

For example, in the first comparative example 810, the first-type ET modulator may include an ETIC 1 801, an ETIC 2 802, an ETIC 3 803, an ETIC 4 804, and/or an ETIC 5 805. In addition, in the first comparative example 810, the first-type communication chip may include a first communication chip com_chip 1 811, a second communication chip com_chip 2 812, a third communication chip com_chip 3 813, a fourth communication chip com_chip 4 814, and/or a fifth communication chip com_chip 5 815. The first communication chip 811 may be connected to the ETIC 1 801 and a first antenna (or antenna module) 821 (for example, the first antenna module 242 in FIG. 2). For example, the first communication chip 811 may process (or amplify) an RF signal in a Sub6 band (for example, about 6 GHa or less) used for a second network (for example, the second network 294 in FIG. 2). The first communication chip 811 may transmit or receive a signal (for example, a radio-frequency signal) through the first antenna 821. The second communication chip 812 may be connected to the ETIC 2 802 and a second antenna 822 (for example, the second antenna module 244 in FIG. 2). For example, the second communication chip 812 may process an RF signal in a 5G Above6 band (for example, about 6 GHz or higher) used for the second network 294. The second communication chip 812 may transmit or receive signals through the second antenna 822.

According to various embodiments, if the ETIC 1 801 is connected to the first communication chip 811 and the second communication chip 812 and then used, the second length L2 between the ETIC 1 801 and the second communication chip 812 may be larger than the first length L1 between the ETIC 1 801 and the first communication chip 811. As used herein, the first length L1 or the second length L2 may refer to the length between the output terminal of the ETIC (for example, the terminal through which an envelope signal (for example, a voltage) is output from the ETIC) and the input terminal of the amplifier included in the communication chip (for example, the terminal to which the envelope signal from the ETIC is input). Signal distortion may occur if the length between the ETIC and the communication chip increases, as in the case of the second length L2, the third length L3, or the fourth length L4.

The signal distortion may worsen if the length (or distance) between the ETIC and the communication chip or the signal bandwidth increases. For example, if the first communication chip 811 and the second communication chip 812 transmit signals in a wide bandwidth of 100 MHz or larger, signal distortion may occur due to the distance between the ETIC 1 801 and the second communication chip 812. In order to remedy such a drawback, one ETIC may be disposed on one communication chip in the first comparative example 810. The more communication chips included in the electronic device 101, the more ETICs need to be disposed, and this may increase the ETIC mounting area or the ETIC disposition cost.

As another example, the third communication chip 813 may be connected to the ETIC 3 803 and a third antenna 823 (for example, the third antenna module 246 in FIG. 2). For example, the third communication chip 813 may process an RF signal in an intermediate frequency band (for example, about 9 GHz to about 11 GHz) used for the second network 294. The third communication chip 813 may transmit or receive signals through the third antenna 823. The fourth communication chip 814 may be connected to the ETIC 4 804 and a fourth antenna LB 824. For example, the fourth communication chip 814 may process an RF signal in a low-band frequency band (for example, about 700 MHz to about 3 GHz) used for the first network (for example, the first network 292 in FIG. 2). The fourth communication chip

814 may transmit or receive signals through the fourth antenna 824. The fifth communication chip 815 may be connected to the ETIC 5 805 and a fifth antenna OMH 825. For example, the fifth communication chip 815 may process an RF signal in an intermediate frequency band or a high-band frequency band used for the first network 292. The fifth communication chip 815 may transmit or receive signals through the fifth antenna 825.

According to various embodiments, the structure in which ET modulators and communication chips are disposed may vary depending on the implementation. For example, the first communication chip 811 to the third communication chip 813 are illustrated in the diagram as being disposed closer to the upper end, with reference to the center of the electronic device 101, than the fourth communication chip 814 and the fifth communication chip 815. The fourth communication chip 814 and the fifth communication chip 815 may instead be disposed closer to the upper end, with reference to the center of the electronic device 101, than the first communication chip 811 to the third communication chip 813.

Figure 8B:
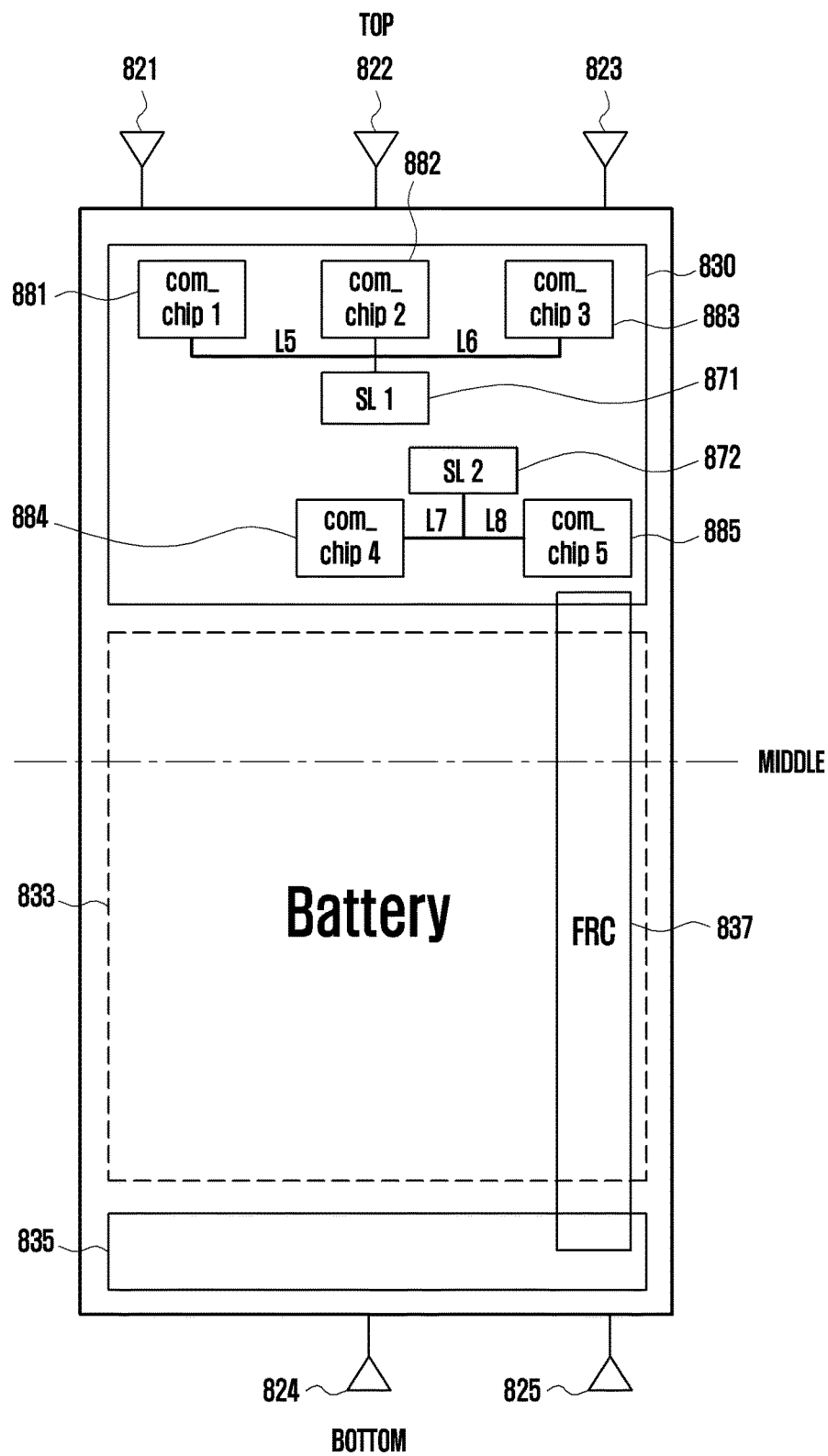
FIG. 8B is a diagram illustrating an example structure in which components included in an electronic device are disposed according to an embodiment.

FIG. 8B is a diagram illustrating an example structure in which components included in an electronic device are disposed according to various embodiments.

Referring to FIG. 8B, the first disposition structure 850 may illustrate a structure in which, when the circuit board of an electronic device 101 is implemented as a half board, a second-type ET modulator and a second-type communication chip are disposed inside the half board. The second-type ET modulator may refer to the ET modulator 450 illustrated in FIG. 4B or the ET modulator 470 in FIG. 4C. The second-type communication chip may refer to the first communication chip 310 in FIG. 6B or FIG. 6C. The circuit board of the electronic device 101 may include a first substrate 830 and a second substrate 835 and may have a structure in which an FPCB-type RF cable (FRC) 837 connects the first substrate 830 and the second substrate 835. In addition, the electronic device may include a battery 833 between the first substrate 830 and the second substrate 835. For example, the first substrate 830 may be the main circuit board, and the second substrate 835 may be the sub circuit board. The first substrate 830 may have a second-type ET modulator and a second-type communication chip disposed thereon.

According to various embodiments, assuming that the user views the display of the electronic device 101 (for example, the display device 160 in FIG. 1) from the front (or the user views the rear surface of the electronic device 101 (opposite to the display)), the position in which the first substrate 830 is disposed on the diagram may correspond to the upper end with reference to the center of the electronic device 101, and the position in which the second substrate 835 is disposed on the diagram may correspond to the lower end with reference to the center of the electronic device 101. As another example, the position in which the first substrate 830 is disposed may correspond to the lower end with reference to the center of the electronic device 101, and the position in which the second substrate 835 is disposed may correspond to the upper end with reference to the center of the electronic device 101. This is only an example of implementing the electronic device 101, and descriptions thereof do not limit the disclosure.

According to the first disposition structure 850, if the electronic device 101 includes multiple communication chips and five antennas connected to the multiple communication chips, a second-type ET modulator may be disposed so as to correspond to the communication chips. The second-type ET modulator may include a switching regulator 430 as in FIG. 4B, or the first switching regulator 430 or the second switching regulator 435 as in FIG. 4C. The second-type ET modulator, which includes a switching regulator, may hereinafter be referred to as a switching regulator as a whole. The second-type communication chip refer to the first communication chip 310 in FIG. 6B or FIG. 6C, and may include at least one of the first amplifier 310, the multiple linear regulators 680, the low-noise amplifier 620, the MIPI controller 640, the filter/duplexer 630, or the antenna switch (ASW) 650 illustrated in FIG. 6B, for example.

For example, in the first disposition structure 850, the second-type ET modulator may include a first switching regulator SL 1 871 or a second switching regulator SL 2 872. In addition, in the first disposition structure 850, the second-type communication chip may include a first communication chip com_chip 1 881, a second communication chip com_chip 2 882, a third communication chip com_chip 3 883, a fourth communication chip com_chip 4 884, and/or a fifth communication chip com_chip 5 885. According to an embodiment, the first communication chip 881, the second communication chip 882, and the third communication chip 883 may be connected to the first switching regulator 871, and the fourth communication chip 884 and the fifth communication chip 885 may be connected to the second switching regulator 872. In an embodiment, the first communication chip 881 may be connected to the first antenna 821, the second communication chip 882 may be connected to the second antenna 822, the third communication chip 883 may be connected to the third antenna 823, the fourth communication chip 884 may be connected to the fourth antenna 824, and the fifth communication chip 885 may be connected to the fifth antenna 825.

For example, the first communication chip 881 may process (or amplify) an RF signal in a Sub6 band (for example, about 6GH or less) used for the second network (for example, the second network 294 in FIG. 2). The second communication chip 882 may process an RF signal in a 5G Above6 band (for example, about 6GH or higher) used for the second network 294. In addition, the third communication chip 883 may process an RF signal in an intermediate frequency band (for example, about 9 GHz to about 11 GHz) used for the second network 294. The fourth communication chip 884 may process an RF signal in a low-band frequency band (for example, about 700 MHz to about 3 GHz) used for the first network (for example, the first network 292 in FIG. 2). The fifth communication chip 885 may process an RF signal in an intermediate frequency band or a high-band frequency band used for the first network 292.

According to various embodiments, in the first disposition structure 850, the first switching regulator 871 may be connected to the first communication chip 881, the second communication chip 882, and/or the third communication chip 883 and then used. According to an embodiment, a linear regulator (for example, the multiple linear regulators 680 in FIG. 6B) is included in the first communication chip 881, the second communication chip 882, and/or the third communication chip 883. For example, the linear regulator included in the first communication chip 881, the second communication chip 882, and/or the third communication chip 883 may receive a voltage supplied from the first switching regulator 871 and may provide the voltage to an amplifier included in the communication chip. The linear regulator may control the voltage (or signal) more minutely than the first switching regulator 871 and, since the same is included in the communication chip, a signal output from the linear regulator may be input to the amplifier with no distortion.

According to various embodiments, if the signal output from the linear regulator is distorted, the electronic device 101 may be more heavily affected than in the case of distortion of a signal output from the switching regulator. A comparison between the first comparative example 810 and the first disposition structure 850 shows that the length (for example, L5, L6, L7, or L8) between the first switching regulator 871 and each communication chip in the first disposition structure 850 may be equal to or larger than the distance (for example, L2, L3, or L4) between the ETIC and each communication chip 812 in the first comparative example 810. In the first disposition structure 850, even if the length between the first switching regulator 871 and the first communication chip 881, the second communication chip 882, or the third communication chip 883 is large, a signal output from a linear regulator may be input to an amplifier with no distortion because the linear regulator is included in the first communication chip 881, the second communication chip 882, or the third communication chip 883.

According to an embodiment, if the first communication chip 881, the second communication chip 882, or the third communication chip 883 transmits a signal in a wide bandwidth equal to/higher than 100 MHz, minute control is performed by the linear regulator included in the first communication chip 881, the second communication chip 882, or the third communication chip 883, and signal distortion (for example, noise) resulting from the length between the first switching regulator 871 and the first communication chip 881, the second communication chip 882, or the third communication chip 883 may accordingly be reduced. In addition, since one switching regulator is disposed per two or three communication chips in the first disposition structure 850, the number of switching regulators to be disposed may not increase even if more communication chips are included in the electronic device 101. This is because one switching regulator can provide a voltage to two or three communication chips such that, in the first disposition structure 850, the area in which switching regulators or the cost for disposing them may be less than in the comparative example 810. In addition, compared with the first comparative example 810, the first disposition structure 850 may have a reduced number of switching regulators corresponding to the ETIC such that components included in the electronic device 101 may be more freely disposed and used. In addition, multiple linear regulators optimized for each communication chip may be disposed in the first disposition structure 850 such that the ET technology can be implemented efficiently with regard to signals corresponding to 5G frequency bands.

According to various embodiments, the structure in which switching regulators and communication chips are disposed may vary depending on the implementation. For example, the first communication chip 811 to the third communication chip 813 are illustrated in the diagram as being disposed closer to the upper end, with reference to the center of the electronic device 101, than the fourth communication chip 814 and the fifth communication chip 815. The fourth communication chip 814 and the fifth communication chip 815 may instead be disposed closer to the upper end of the electronic device 101 than the first communication chip 811 to the third communication chip 813. As another example, the number of switching regulators, communication chips, or antennas included in the electronic device 101 may not be limited to FIG. 8B.

Figure 9A:
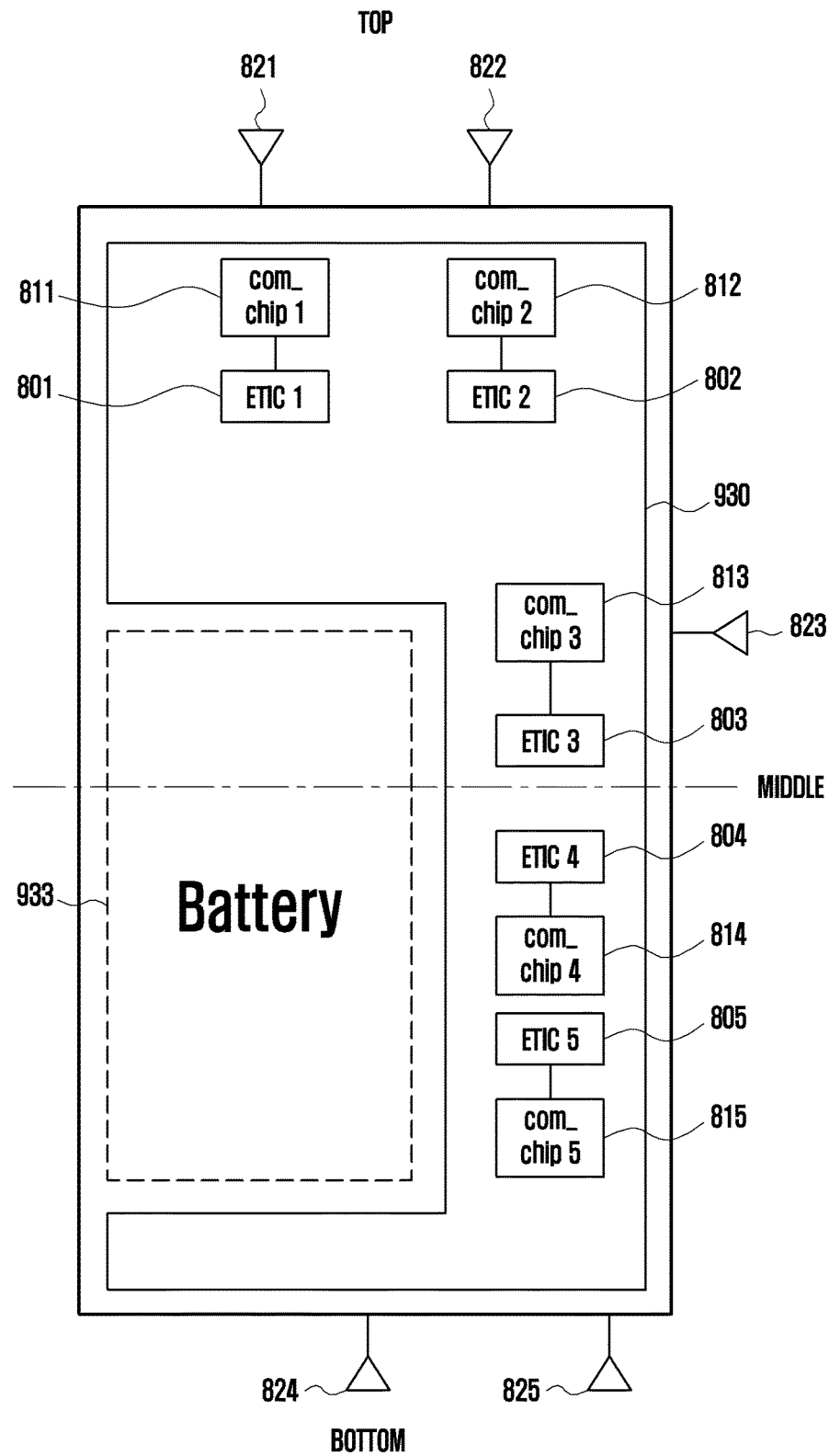
FIG. 9A is a diagram illustrating an example structure in which components included in an electronic device are disposed according to various embodiments.

FIG. 9A is a diagram illustrating an example structure in which components included in an electronic device are disposed according to a comparative example.

Referring to FIG. 9A, the second comparative example 910 may illustrate a structure in which, when the circuit board of an electronic device is implemented as a "⊐"-shaped board (or a board having a U-shape rotated by 90° clockwise or counterclockwise), a first-type ET modulator (for example, the ET modulator 400 in FIG. 4A) and a first-type communication chip (for example, the communication chip 600 in FIG. 6A) are disposed inside the "⊐"-shaped board. The electronic device may include a "⊐"-shaped main circuit board 930 and a battery 933. The first-type ET modulator and the first-type communication chip may be disposed on the main circuit board 930.

The second comparative example 910 and the first comparative example 810, compared with each other, differ only in the structure in which the ETIC and the communication chip are disposed according to the circuit board type. Details of the ETIC and the communication chip have been described in detail with reference to FIG. 8A, and repeated descriptions thereof may not be repeated here.

According to various embodiments, if an ETIC 1 801 is connected to a first communication chip 811 and a second communication chip 812 and then used, the second length L2 between the ETIC 1 801 and the second communication chip 812 may be larger than the length L1 between the ETIC 1 801 and the first communication chip 811. As used herein, the first length L1 or the second length L2 may refer to the length between the output terminal of the ETIC and the input terminal of the amplifier included in the communication chip (for example, the terminal to which the envelope signal from the ETIC is input). Signal distortion may occur if the length between the ETIC 1 801 and the second communication chip 812 increases, as in the case of the second length L2. In order to remedy such a drawback, one first-type communication chip may be disposed on one first-type ET modulator in the second comparative example 910.

Figure 9B:
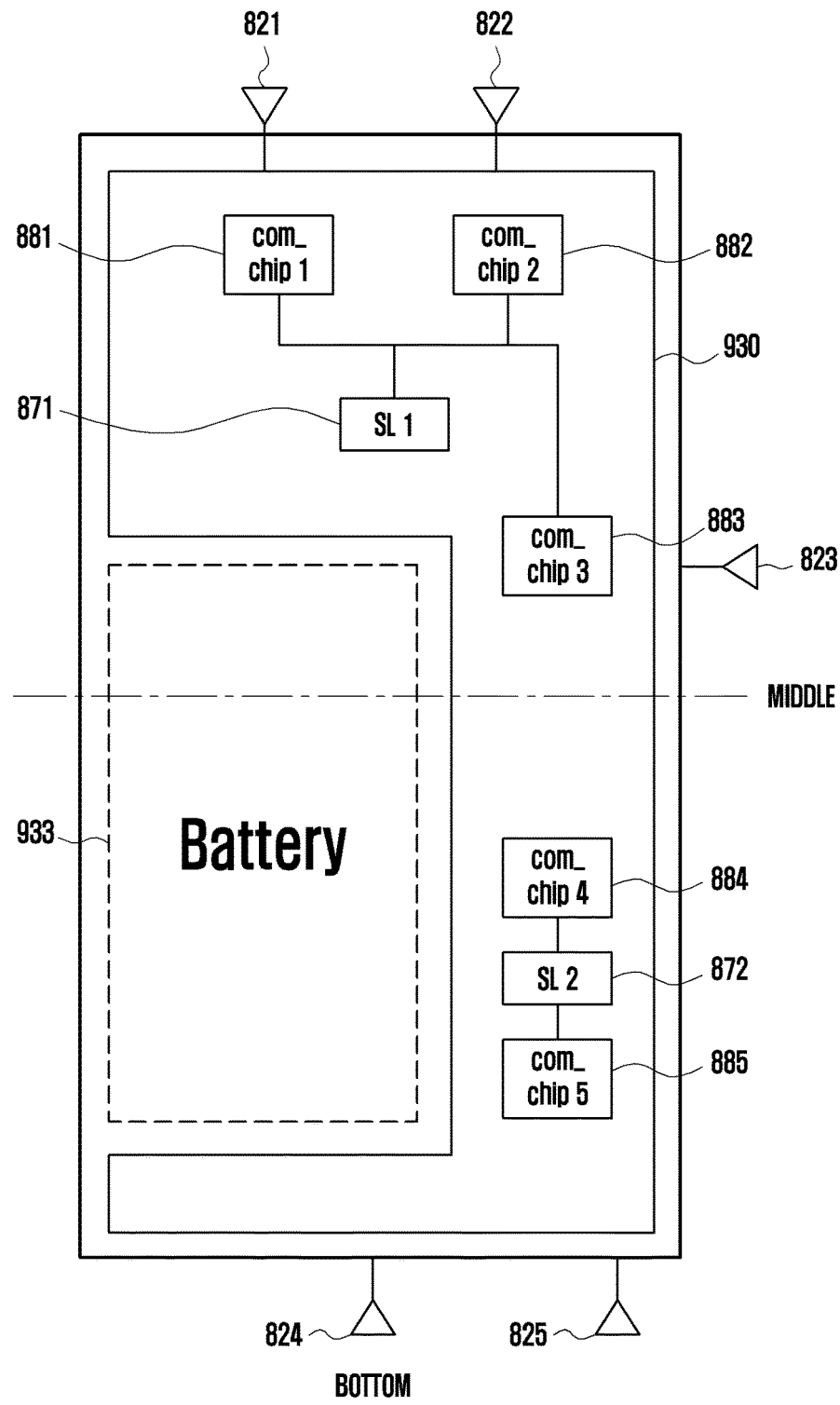
FIG. 9B is a diagram illustrating an example structure in which components included in an electronic device are disposed according to various embodiments.

FIG. 9B is a diagram illustrating an example structure in which components included in an electronic device are disposed according to various embodiments.

Referring to FIG. 9B, the second disposition structure 950 may illustrate a structure in which, when the circuit board of an electronic device 101 is implemented as a "⊐"-shaped board (or a board having a U-shape rotated by 90° clockwise or counterclockwise), a second-type ET modulator (for example, the ET modulator 450 in FIG. 4B or the ET modulator 470 in FIG. 4C) and a second-type communication chip (for example, the first communication chip 310 in FIG. 6B or FIG. 6C) are disposed inside the "⊐"-shaped board. The electronic device 101 may include a "⊐"-shaped main circuit board 930 and a battery 933. The second-type ET modulator and the second-type communication chip may be disposed on the main circuit board 930.

The second disposition structure 950 and the first disposition structure 850, compared with each other, differ only in the structure in which the switching regulator and the communication chip disposed according to the circuit board type. Details of the switching regulator and the communication chip have been described in detail with reference to FIG. 8B, and repeated descriptions thereof may not be repeated here.

According to various embodiments, in the second disposition structure 950, a first switching regulator 871 may be connected to a first communication chip 881, a second communication chip 882, and a third communication chip 883 and then used. For example, the first communication chip 881 and the second communication chip 882 may be disposed adjacent to the upper end, with reference to the center of the electronic device 101, and the third communication chip 883 may be disposed adjacent to the center of the electronic device 101. As another example, in the second disposition structure 950, a second switching regulator 872 may be connected to a fourth communication chip 884 and a fifth communication chip 885 and then used. The fourth communication chip 884 and the fifth communication chip 885 may be disposed adjacent to the lower end with reference to the center of the electronic device 101.

A comparison between the second comparative example 910 and the second disposition structure 950 shows that the length (for example, L5, L6, or L7) between the first switching regulator 871 and each communication chip in the second disposition structure 950 may be equal to or larger than the second length L2 between the ETIC 1 801 and the second communication chip 812 in the second comparative example 910. In the second disposition structure 950, even if the length between the first switching regulator 871 and the first communication chip 881, the second communication chip 882, or the third communication chip 883 is large, a signal output from a linear regulator may be input to an amplifier with no distortion because the linear regulator is included in the first communication chip 881, the second communication chip 882, or the third communication chip 883.

According to various embodiments, the structure in which switching regulators and communication chips are disposed may vary depending on the implementation. For example, the first communication chip 881 and the second communication chip 882 are illustrated in the diagram as being disposed closer to the upper end, with reference to the center of the electronic device 101, than the fourth communication chip 814 and/or the fifth communication chip 815. The fourth communication chip 814 and/or the fifth communication chip 815 may instead be disposed at the upper end with reference to the center of the electronic device 101, and the first communication chip 881 and/or the second communication chip 882 may be disposed closer to the lower end with reference to the center of the electronic device 101.

Figure 10:
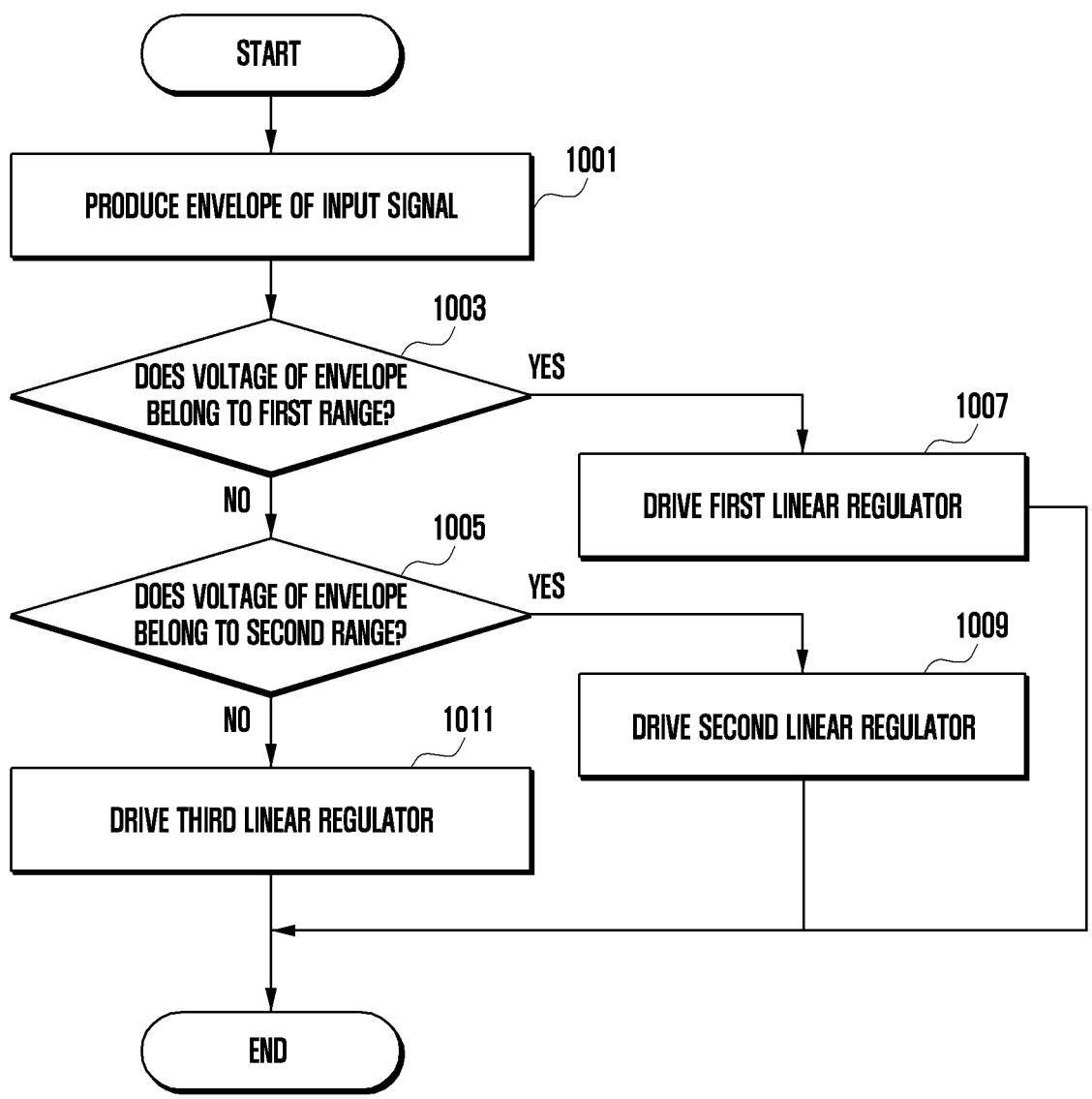
FIG. 10 is a flowchart illustrating an example method for operating an electronic device according to various embodiments.

FIG. 10 is a flowchart illustrating example operations of an electronic device according to various embodiments.

Referring to FIG. 10, in operation 1001, a control circuit 330 (or an ET DAC 660) of an electronic device according to various embodiments (for example, the electronic device 101 in FIG. 1) may produce an envelope of an input signal. The input signal, which is input to a communication chip (for example, the first communication chip 310 in FIG. 3A to FIG. 3C) of the electronic device 101, may refer to a signal related to communication (for example, wireless communication) from a communication processor (for example, the first communication processor 212 in FIG. 2). The input signal may be input to an amplifier (for example, the first amplifier 311 in FIG. 3A to FIG. 3C) included in the first communication chip 310. The control circuit 330 may produce an envelope (or an envelope signal) based on the input signal. The control circuit 330 may provide the produced envelope to a linear regulator (for example, the first linear regulator 313 or the second linear regulator 315 in FIG. 3A to FIG. 3C).

In operation 1003, the control circuit 330 may determine whether the voltage of the envelope of the input signal is in a first range. The first linear regulator 313 or the second linear regulator 315 may be configured (or designed) to operate (or to be driven) if the voltage of the envelope corresponds to the configured range. The control circuit 330 may control the first linear regulator 313 or the second linear regulator 315 so as to selectively operate based on the voltage of the envelope of the input signal. The control circuit 330 may control so as to perform operation 1007 if the voltage of the envelope of the input signal corresponds to the first range ("Yes" in operation 1003), and may operate so as to perform operation 1005 if the voltage of the envelope of the input signal does not correspond to the first range ("No" in operation 1003).

If the voltage of the envelope of the input signal does not correspond to the first range, the control circuit 330 may determine, in operation 1005, whether the voltage of the envelope of the input signal is in a second range. If the voltage of the envelope of the input signal is in the second range ("Yes" in operation 1005), the control circuit 330 may control so as to perform operation 1009, and if the voltage of the envelope of the input signal is not in the second range ("No" in operation 1005), the control circuit 330 may control so as to perform operation 1011.

If the voltage of the envelope of the input signal corresponds to the first range, the control circuit 330 may drive the first linear regulator 313 in operation 1007. Using a first voltage supplied from the switching regulator 340, the first linear regulator 313 may provide a third voltage to the first amplifier 311 included in the first communication chip 310 according to the envelope of the input signal. For example, the third voltage may be equal to or higher than the first voltage.

If the voltage of the envelope of the input signal corresponds to the second range, the control circuit 330 may drive the second linear regulator 315 in operation 1009. Using a second voltage supplied from the switching regulator 340, the second linear regulator 315 may provide a fourth voltage to the first amplifier 311 included in the first communication chip 310 according to the envelope of the input signal. For example, the second voltage may be higher than the first voltage. For example, the fourth voltage may be equal to or higher than the second voltage and may be higher than the third voltage.

If the voltage of the envelope of the input signal does not correspond to the second range ("No" in operation 1005), the control circuit 330 may drive the third linear regulator 317 in operation 1011. Using a fifth voltage supplied from the switching regulator 340, the third linear regulator 317 may provide a seventh voltage according to the envelope of the input signal. For example, the fifth voltage may be higher than the first voltage or the second voltage. The seventh voltage may be equal to or higher than the fifth voltage and may be higher than the fourth voltage.

Although it has been assumed in the description with reference to FIG. 10 that three linear regulators are included, the disclosure is not limited by the description.

Figure 11:
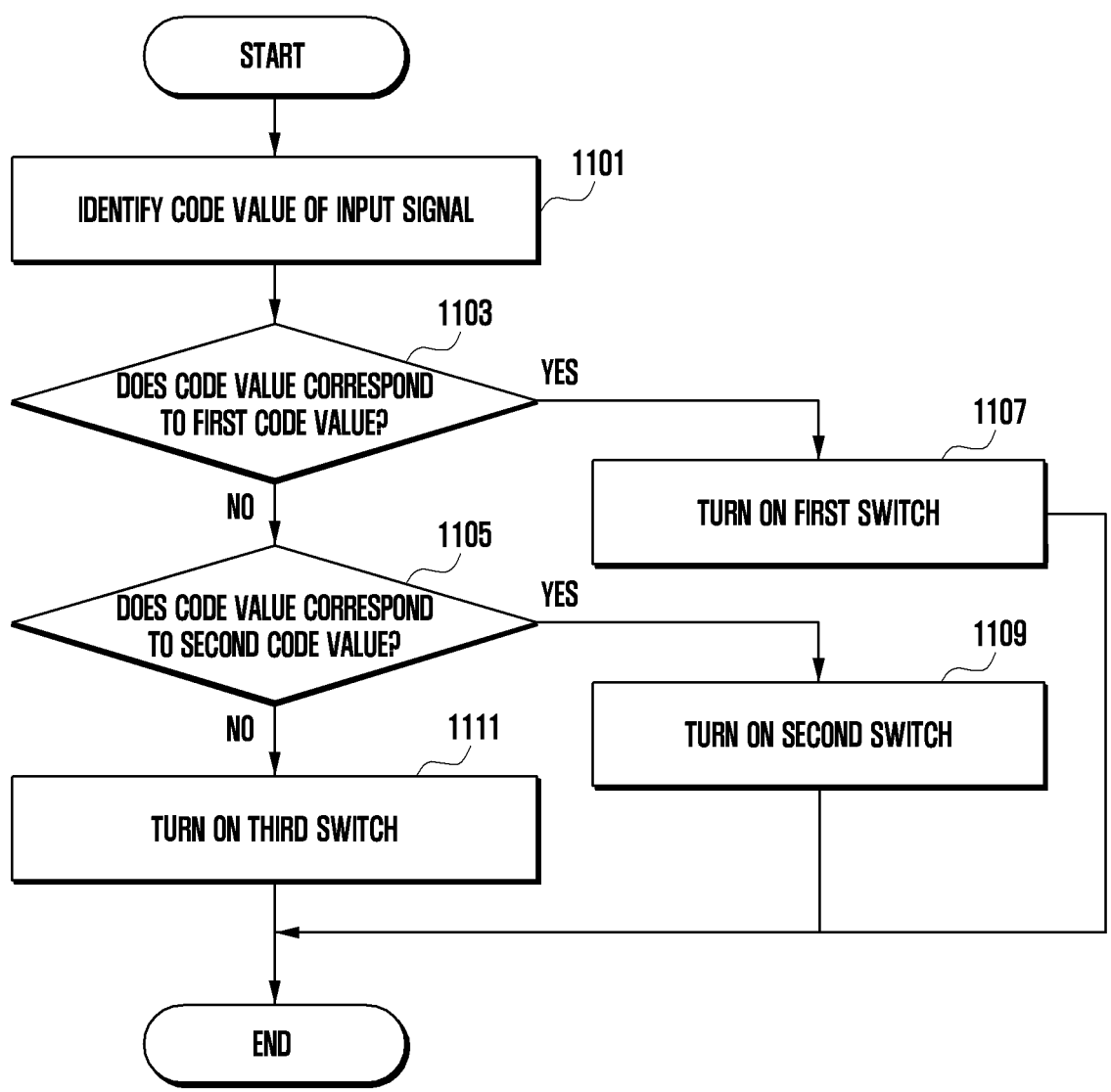
FIG. 11 is a flowchart illustrating an example method for operating an electronic device according to various embodiments.

FIG. 11 is a flowchart illustrating example operations of an electronic device according to various embodiments. FIG. 11 may illustrate operations performed in a situation (or state) in which no ET technology is applied to an amplifier included in a communication chip.

Referring to FIG. 11, in operation 1101, a control circuit 330 (or an ET DAC 660) of an electronic device according to various embodiments (for example, the electronic device 101 in FIG. 1) may identify a code value of an input signal (for example, a first input signal). The control circuit 330 may implement an APT operation or an SPT operation based on the code value of the input signal. According to various embodiments, a memory (for example, the memory 130 in FIG. 1) of the electronic device 101 may have a signal control table stored therein in connection with application of the APT technology or SPT technology.

In operation 1103, the control circuit 330 may determine whether the code value of the input signal corresponds to a first code value. The control circuit 330 may determine whether the code value of the input signal corresponds to the first code value based on the signal control table stored in the memory 130. If the code value of the input signal corresponds to the first code value ("Yes" in operation 1103), the control circuit 330 may perform operation 1107, and if the code value of the input signal does not correspond to the first code value ("No" in operation 1103), the control circuit 330 may perform operation 1105.

If the code value of the input signal corresponds to the first code value ("Yes" in operation 1103), the control circuit 330 may turn on the first switch 351 in operation 1107. By turning on the first switch 351, the control circuit 330 may control a voltage (for example, a first voltage) supplied from the switching regulator 340 to the first linear regulator 313 so as to be supplied to the first amplifier 311 with no change.

If the code value of the input signal does not correspond to the first code value ("No" in operation 1103), the control circuit 330 may determine, in operation 1105, whether the code value of the input signal corresponds to a second code value. The control circuit 330 may identify whether the code value of the input signal corresponds to the second code value based on a signal control table stored in the memory 130. If the code value of the input signal corresponds to the second code value ("Yes" in operation 1105), the control circuit 330 may perform operation 1109, and if the code value of the input signal does not correspond to the second code value ("No" in operation 1105), the control circuit 330 may perform operation 1111.

If the code value of the input signal corresponds to the second code value ("Yes" in operation 1105), the control circuit 330 may turn on the second switch 353 in operation 1109. By turning on the second switch 353, the control circuit 330 may control a voltage (for example, a second voltage) supplied from the switching regulator 340 to the second linear regulator 315 so as to be supplied to the first amplifier 311 with no change.

If the code value of the input signal does not correspond to the second code value ("No" in operation 1105), the control circuit 330 may turn on the third switch 355 in operation 1111. By turning on the third switch 355, the control circuit 330 may control a voltage (for example, a fifth voltage) supplied from the switching regulator 340 to the third linear regulator 317 so as to be supplied to the first amplifier 311 with no change.

Although it has been assumed in the description with reference to FIG. 11 that three switches are included, the disclosure is not limited by the description.

An electronic device according to various example embodiments (for example, the electronic device 101 in FIG. 1) may include: an antenna (for example, the first antenna module 197 in FIG. 1 or the first antenna module 242 in FIG. 2); a switching regulator (for example, the switching regulator 340 in FIG. 3A to FIG. 3C); a communication chip (for example, the first communication chip 310 in FIG. 3A to FIG. 3C) including an amplifier (for example, the first amplifier 311 in FIG. 3A to FIG. 3C), a first linear regulator (for example, the first linear regulator 313 in FIG. 3A to FIG. 3C) operably connected to the amplifier and the switching regulator and configured to be supplied with a first voltage from the switching regulator, and a second linear regulator (for example, the second linear regulator 315 in FIG. 3A to FIG. 3C) operably connected to the amplifier and the switching regulator and configured to be supplied with a second voltage higher than the first voltage from the switching regulator, the communication chip configured to transmit a radio-frequency signal outside of the electronic device through the antenna; and a control circuit. The control circuit (for example, the control circuit 330 in FIG. 3A to FIG. 3C) may be configured to produce an envelope of an input signal input to the amplifier in connection with the radio-frequency signal and to provide the produced envelope to at least one of the first linear regulator or the second linear regulator. The first linear regulator may be configured to provide a third voltage corresponding to the envelope to the amplifier using the first voltage based on the envelope having a voltage in a first range. The second linear regulator may be configured to provide a fourth voltage higher than the third voltage to the amplifier using the second voltage based on the voltage of the envelope being in a second range including values larger than values included in the first range.

The control circuit may be configured to control the envelope, thereby controlling the first linear regulator or the second linear regulator so as to operate selectively.

The switching regulator may be configured to provide the first voltage to the first linear regulator and to provide the second voltage to the second linear regulator.

The switching regulator may be configured to include: a first switching regulator (for example, the first switching regulator 430 in FIG. 4C) configured to provide the first voltage to the first linear regulator; and a second switching regulator (for example, the second switching regulator 435 in FIG. 4C) configured to provide the second voltage to the second linear regulator.

The communication chip may further include: a first switch (for example, the first switch 351 in FIG. 3B) operably connected to the switching regulator and the first linear regulator; and a second switch (for example, the second switch 353 in FIG. 3B) operably connected to the switching regulator and the second linear regulator. The control circuit may be configured to control the first switch and/or the second switch such that a voltage supplied from the switching regulator is provided to the amplifier.

The control circuit may be configured to turn on the first switch, based on the input signal having a code value corresponding to a first code value, such that the first voltage supplied from the switching regulator to the first linear regulator is provided to the amplifier.

The control circuit may be configured to turn on the second switch, based on the input signal having a code value corresponding to a second code value, such that the second voltage supplied from the switching regulator to the second linear regulator is provided to the amplifier.

The control circuit may be configured to turn off the first switch, based on the envelope having a voltage in the first range, and to turn off the second switch, based on the voltage of the envelope being in the second range.

Based on the first switch being turned off, the first linear regulator may be configured to provide a third voltage corresponding to the envelope of the input signal as a power supply to the amplifier, based on the envelope having a voltage in the first range. Based on the second switch being turned off, the second linear regulator may be configured to provide the fourth voltage as a power supply to the amplifier, based on the voltage of the envelope corresponding to the second range.

The control circuit may be configured to include an envelope-tracking digital-analog converter (ET DAC) (for example, the ET DAC 660 in FIG. 6B).

The ET DAC may be disposed inside the communication chip or outside the communication chip.

A first length between the switching regulator and the amplifier may be longer than a second length between the linear regulator and the amplifier.

The electronic device may further include a second communication chip (for example, the second communication chip 320 in FIG. 3C) including: a second amplifier (for example, the second amplifier 321 in FIG. 3C), a third linear regulator (for example, the third linear regulator 323 in FIG. 3C) operably connected to the second amplifier and the switching regulator and configured to be supplied with a fifth voltage from the switching regulator; and a fourth linear regulator (for example, the fourth linear regulator 325 in FIG. 3C) operably connected to the second amplifier and the switching regulator and configured to be supplied with a sixth voltage higher than the fifth voltage from the switching regulator. The second communication chip may be configured to transmit a second radio-frequency signal through the antenna.

The control circuit may be configured to produce a second envelope of a second input signal input to the second amplifier in connection with the second radio-frequency signal and to provide the produced second envelope to at least one of the third linear regulator or the fourth linear regulator. The third linear regulator may be configured to provide a seventh voltage corresponding to the envelope of the second input signal to the second amplifier using the fifth voltage, based on the second envelope having a voltage in a third range. The fourth linear regulator may be configured to provide an eighth voltage higher than the seventh voltage to the second amplifier using the sixth voltage, based on the voltage of the second envelope being in a fourth range including values larger than values included in the third range.

A first length between the switching regulator and the amplifier may be shorter than a third length between the switching regulator and the second amplifier.

A communication chip (for example, the first communication chip 310 in FIG. 3A to FIG. 3C) configured to process a radio-frequency signal received and/or transmitted in an electronic device according to various embodiments may include: an amplifier (for example, the first amplifier 311 in FIG. 3A to FIG. 3C); a first linear regulator (for example, the first linear regulator 313 in FIG. 3A to FIG. 3C) operably connected to the amplifier; and a second linear regulator (for example, the second linear regulator 315 in FIG. 3A to FIG. 3C) operably connected to the amplifier. The first linear regulator may be configured to receive a first voltage supplied from the switching regulator of the electronic device and to provide a third voltage to the amplifier using the first voltage. The second linear regulator may be configured to receive a second voltage supplied from the switching regulator and to provide a fourth voltage to the amplifier using the second voltage.

The first linear regulator may be configured to receive an envelope of a radio-frequency signal to be transmitted from a control circuit of the electronic device and to provide the third voltage to the amplifier so as to correspond to the envelope, based on the envelope having a voltage corresponding to a first range. The amplifier may be configured to amplify the radio-frequency signal using the third voltage.

The second linear regulator may be configured to receive an envelope of an input signal related to a radio-frequency signal to be transmitted from a control circuit of the electronic device and to provide the fourth voltage to the amplifier so as to correspond to the envelope, based on the envelope having a voltage corresponding to a second range. The amplifier may be configured to amplify the input signal using the fourth voltage such that the radio-frequency signal to be transmitted is output.

The communication chip may further include: a first switch (for example, the first switch 351 in FIG. 3B) operably connected to the switching regulator and the first linear regulator; and a second switch (for example, the second switch 353 in FIG. 3B) operably connected to the switching regulator and the second linear regulator.

The amplifier may be configured to receive the first voltage from the switching regulator (e.g., not via the first linear regulator), based on the first switch being turned on, and to receive the second voltage from the switching regulator (e.g., not via the second linear regulator), based on the second switch being turned on.

According to various example embodiments, by including a linear regulator of an ET modulator in a communication chip, an ET technology may be applied with regard to a signal in a wide bandwidth between the linear regulator and the communication chip.

According to various example embodiments, by including multiple linear regulators in a communication chip so as to provide different voltages, the multiple linear regulators may provide a voltage corresponding to an amplifier.

According to various example embodiments, by supplying a power supply (or voltage) to multiple power amplifiers through a small number of ET modulators, the area in which components of an electronic device are mounted may be reduced, and the cost of using components may be decreased.

While the disclosure has been illustrated and described with reference to various example embodiments, it will be understood that the various example embodiments are intended to be illustrative, not limiting. It will be further understood by one of ordinary skill in the art that various changes in form and detail may be made without departing from the true spirit and full scope of the disclosure, including the appended claims and their equivalents.

What is claimed is:

1. A communication chip configured to process a radio-frequency signal received and/or transmitted in an electronic device, the communication chip comprising:
   a first power amplifier;
   a first linear regulator operably configured to receive a first voltage supplied from a switching regulator of the electronic device and to provide, using the first voltage, a third voltage to the first power amplifier, wherein the third voltage corresponds to an envelope of an input signal to the first power amplifier and is provided to the first power amplifier based on the envelope having a voltage in a first range; and
   a second linear regulator operably configured to receive a second voltage higher than the first voltage supplied from the switching regulator and to provide, using the second voltage, a fourth voltage to the first power amplifier based on the envelope having a voltage in a second range comprising values greater than values included in the first range,
   wherein the first voltage or the third voltage is selectively supplied to the first power amplifier, and the second voltage or the fourth voltage is selectively supplied to the first power amplifier.

2. The communication chip of claim 1, further comprising:
- a first switch operably connected to the switching regulator and the first linear regulator for providing either the first voltage or the third voltage to the first power amplifier; and
- a second switch operably connected to the switching regulator and the second linear regulator for providing either the second voltage or the fourth voltage to the first power amplifier.

3. The communication chip of claim 1, wherein the switch regulator is included in an envelope-tracking (ET) modulator external to the communication chip.

4. The communication chip of claim 1, wherein a first length between the switching regulator and the first power amplifier is longer than a second length between the first linear regulator and the first power amplifier.

5. An electronic device comprising the communication chip of claim 1.

6. The electronic device of claim 5, further comprising:
another communication chip comprising a second power amplifier, a third linear regulator operably connected to the second power amplifier and the switching regulator and configured to be supplied with a fifth voltage from the switching regulator, and a fourth linear regulator operably connected to the second power amplifier and the switching regulator and configured to be supplied with a sixth voltage higher than the fifth voltage from the switching regulator.

7. The electronic device of claim 5, further comprising:
an envelope-tracking (ET) modulator comprising the switching regulator.

8. The electronic device of claim 7, wherein the ET modulator is external to the communication chip.

* * * * *